US011374008B2

(12) United States Patent
Son

(10) Patent No.: US 11,374,008 B2
(45) Date of Patent: Jun. 28, 2022

(54) SEMICONDUCTOR MEMORY DEVICES AND METHODS OF FABRICATING THE SAME

(71) Applicant: Samsung Electronics Co., Ltd., Suwon-si (KR)

(72) Inventor: Yong-Hoon Son, Yongin-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 17/035,843

(22) Filed: Sep. 29, 2020

(65) Prior Publication Data

US 2021/0104527 A1 Apr. 8, 2021

(30) Foreign Application Priority Data

Oct. 8, 2019 (KR) .................... 10-2019-0124881

(51) Int. Cl.
| | |
|---|---|
| H01L 27/108 | (2006.01) |
| H01L 29/06 | (2006.01) |
| H01L 29/423 | (2006.01) |
| H01L 29/786 | (2006.01) |
| H01L 21/02 | (2006.01) |
| H01L 29/66 | (2006.01) |

(52) U.S. Cl.
CPC .. *H01L 27/10805* (2013.01); *H01L 21/02603* (2013.01); *H01L 27/1085* (2013.01); *H01L 27/10873* (2013.01); *H01L 27/10885* (2013.01); *H01L 29/0673* (2013.01); *H01L 29/42392* (2013.01); *H01L 29/66742* (2013.01); *H01L 29/78696* (2013.01)

(58) Field of Classification Search
CPC ......... H01L 21/02603; H01L 27/10805; H01L 27/1085; H01L 27/10873; H01L 27/10885; H01L 29/0673; H01L 29/42392; H01L 29/66742; H01L 29/78696
USPC ....................................... 257/296
See application file for complete search history.

(56) References Cited

U.S. PATENT DOCUMENTS

| | | |
|---|---|---|
| 8,008,732 B2 | 8/2011 | Kiyotoshi et al. |
| 8,501,609 B2 | 8/2013 | Roizin et al. |
| 10,008,265 B2 | 6/2018 | Hsu |
| (Continued) | | |

FOREIGN PATENT DOCUMENTS

KR 101528806 B1 6/2015

*Primary Examiner* — Tong-Ho Kim
(74) *Attorney, Agent, or Firm* — Myers Bigel, P.A.

(57) ABSTRACT

Disclosed are semiconductor memory devices and methods of fabricating the same. The semiconductor memory devices may include a plurality of layers sequentially stacked on a substrate in a vertical direction, each of the plurality of layers including a bit line extending in a first direction and a semiconductor pattern extending from the bit line in a second direction traversing the first direction, a gate electrode extending through the plurality of layers and including a vertical portion extending through the semiconductor patterns and a first horizontal portion extending from the vertical portion and facing a first surface of one of the semiconductor patterns, and a data storing element electrically connected to the one of the semiconductor patterns. The data storing element includes a first electrode electrically connected to the one of the semiconductor patterns, a second electrode on the first electrode, and a dielectric layer between the first and second electrodes.

20 Claims, 36 Drawing Sheets

(56) References Cited

U.S. PATENT DOCUMENTS

| | | |
|---|---|---|
| 10,090,316 B2 | 10/2018 | Ootsuka |
| 2019/0067375 A1 | 2/2019 | Karda et al. |
| 2019/0103407 A1* | 4/2019 | Kim ........................ H01L 28/86 |

* cited by examiner

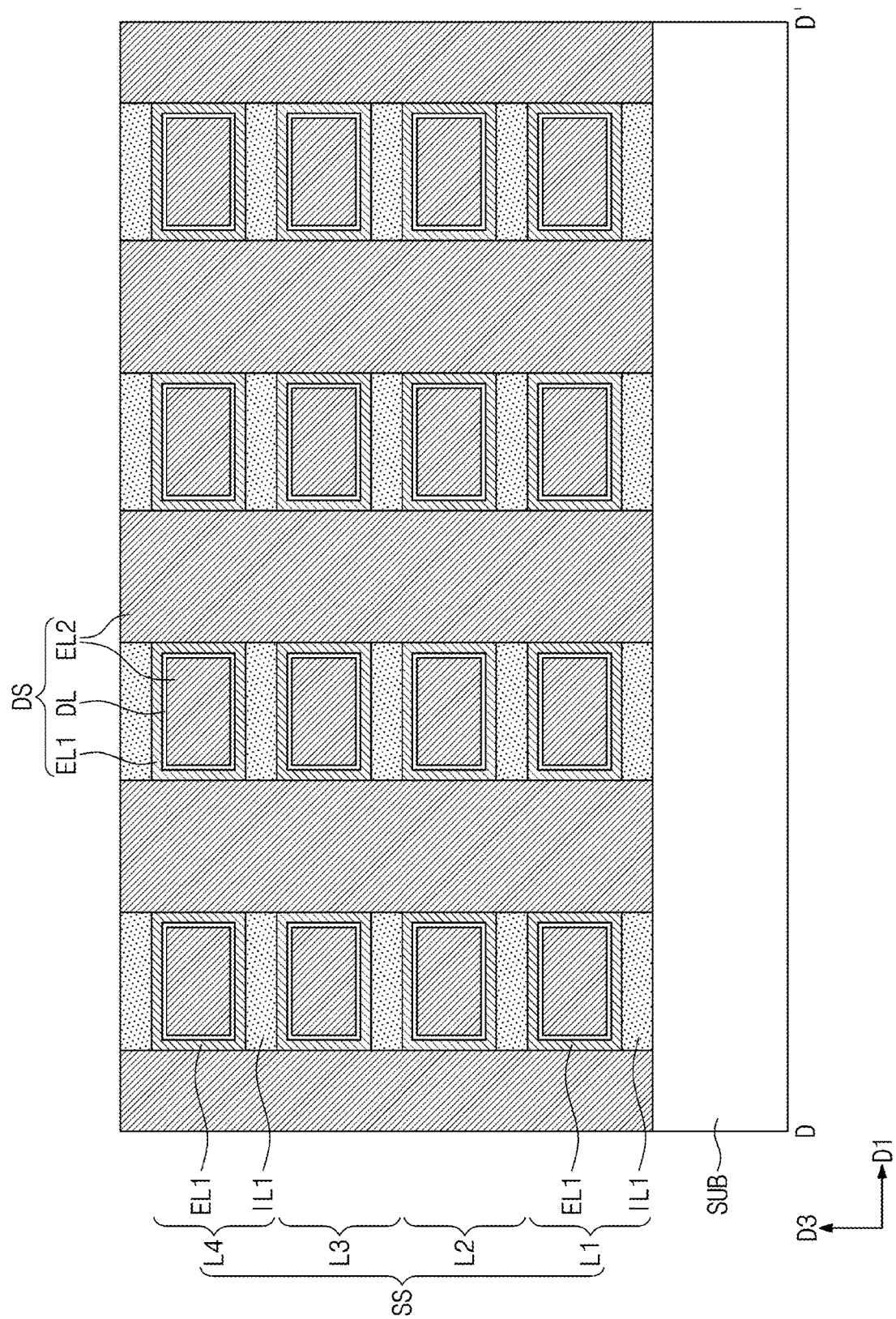

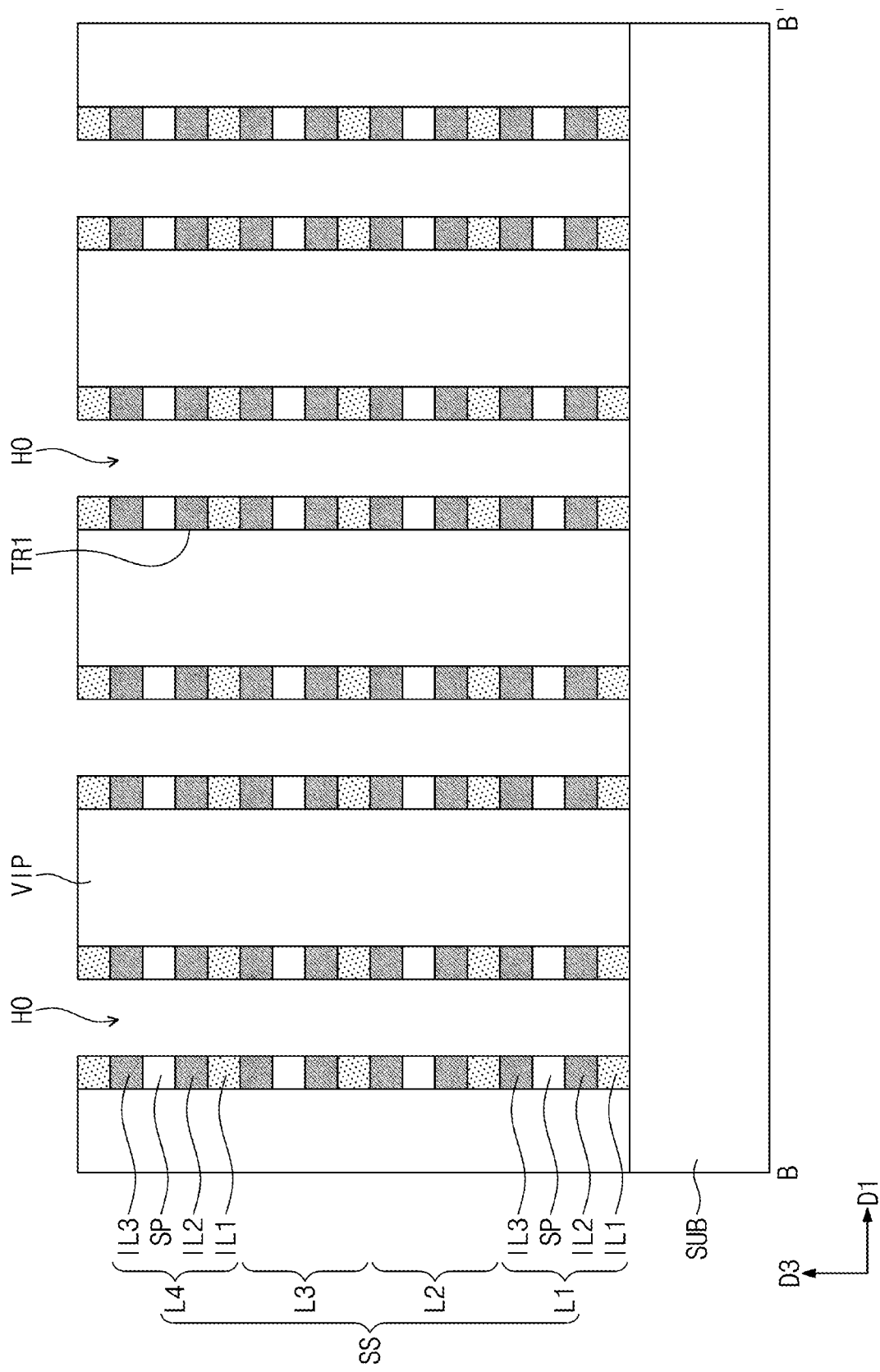

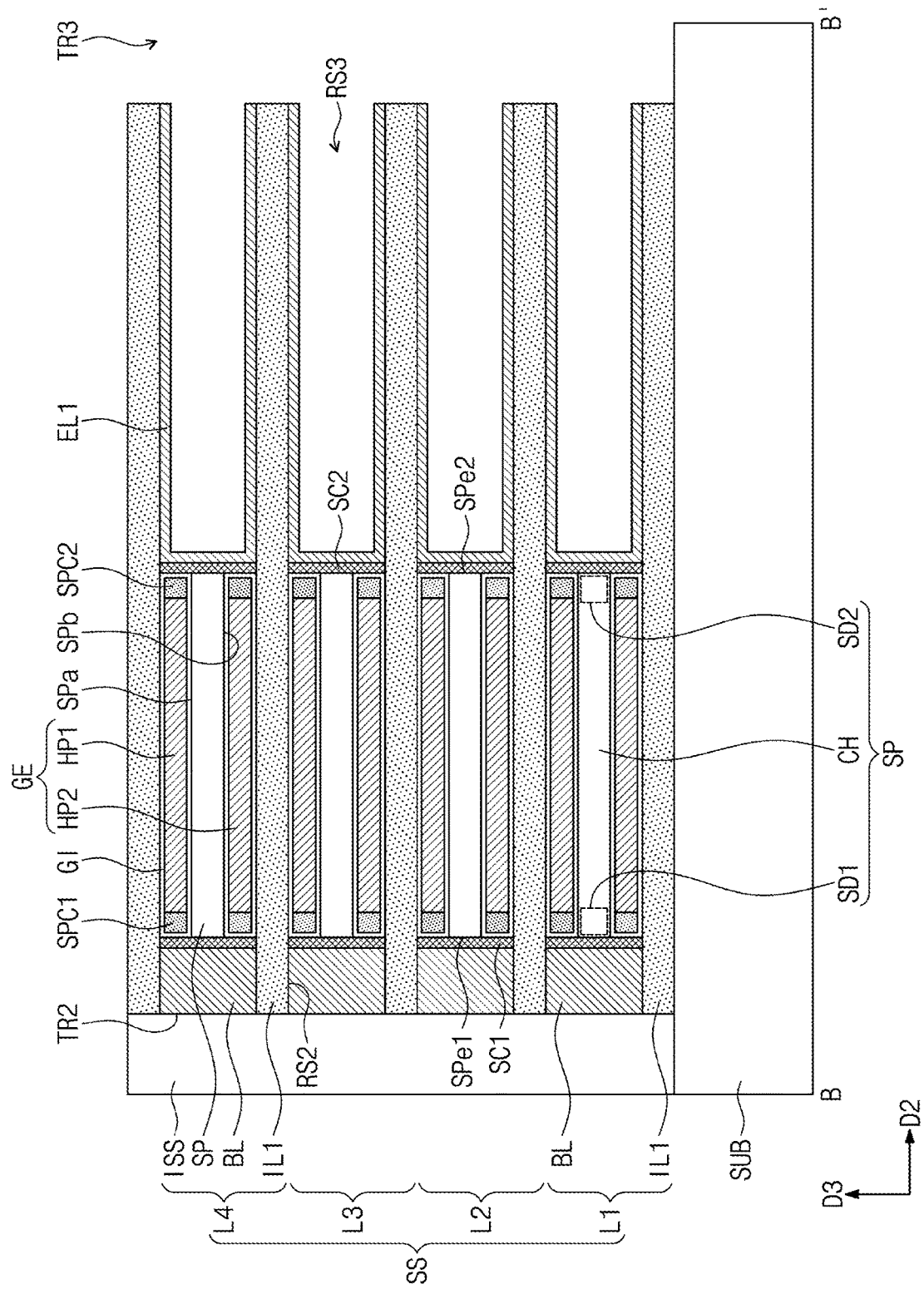

SEMICONDUCTOR MEMORY DEVICES AND METHODS OF FABRICATING THE SAME

CROSS-REFERENCE TO RELATED APPLICATION

This U.S. non-provisional patent application claims priority under 35 U.S.C. § 119 to Korean Patent Application No. 10-2019-0124881, filed on Oct. 8, 2019, in the Korean Intellectual Property Office, the entire contents of which are hereby incorporated by reference.

BACKGROUND

The present disclosure relates to a semiconductor device and a method of fabricating the same, and more particularly, to a three-dimensional semiconductor memory device with improved electrical characteristics and a method of fabricating the same.

Higher integration of semiconductor devices may be beneficial to satisfy consumer demands for superior performance and inexpensive price. In the case of semiconductor devices, since their degree of integration may be one of various factors in determining product prices, an increased degree of integration may be particularly beneficial. In the case of two-dimensional or planar semiconductor devices, since their degree of integration may be mainly determined by the area occupied by a unit memory cell, the degree of integration may be influenced by the level of a fine pattern forming technology. However, the extremely expensive process equipment used to increase pattern fineness may set a practical limitation on increasing a degree of integration for two-dimensional or planar semiconductor devices. To overcome such a limitation, three-dimensional semiconductor memory devices including three-dimensionally arranged memory cells have recently been proposed.

SUMMARY

Some embodiments of the inventive concept provide three-dimensional semiconductor memory devices with improved electrical and reliability characteristics.

Some embodiments of the inventive concept provide methods of fabricating a three-dimensional semiconductor memory device with improved electrical and reliability characteristics.

According to some embodiments of the inventive concept, semiconductor memory devices may include a plurality of layers sequentially stacked on a substrate in a vertical direction, each of the plurality of layers including a bit line extending in a first direction and a semiconductor pattern extending from the bit line in a second direction that traverses the first direction, a gate electrode extending through the plurality of layers and including a vertical portion extending through the semiconductor patterns and a first horizontal portion extending from the vertical portion and facing a first surface of one of the semiconductor patterns, and a data storing element electrically connected to the one of the semiconductor patterns. The data storing element may include a first electrode electrically connected to the one of the semiconductor patterns, a second electrode on the first electrode, and a dielectric layer between the first electrode and the second electrode.

According to some embodiments of the inventive concept, semiconductor memory devices may include a plurality of layers sequentially stacked on a substrate in a vertical direction, each of the plurality of layers including a bit line extending in a first direction and a semiconductor pattern extending from the bit line in a second direction that traverses the first direction, a gate electrode extending through the plurality of layers, and a data storing element electrically connected to one of the semiconductor patterns. The gate electrode may include a vertical portion extending through the semiconductor patterns, a first horizontal portion extending from the vertical portion and facing a first surface of the one of the semiconductor patterns, and a second horizontal portion extending from the vertical portion and facing a second surface of the one of the semiconductor patterns opposite to the first surface of the one of the semiconductor patterns.

According to some embodiments of the inventive concept, semiconductor memory devices may include a bit line extending on a substrate in a first direction, a semiconductor pattern extending in a second direction that traverses the first direction, the semiconductor pattern including a first impurity region, a second impurity region, and a channel region between the first and second impurity regions, the first impurity region being electrically connected to the bit line, a gate electrode including a vertical portion extending through the channel region of the semiconductor pattern and a first horizontal portion extending from the vertical portion and facing a first surface of the semiconductor pattern, and a data storing element electrically connected to the second impurity region of the semiconductor pattern. The channel region may surround the vertical portion of the gate electrode.

According to some embodiments of the inventive concept, methods of fabricating a semiconductor memory device may include forming a stack including a plurality of layers sequentially stacked on a substrate in a vertical direction, each of the plurality of layers including a first insulating layer, a semiconductor layer, and a second insulating layer sequentially stacked on the substrate, forming a plurality of semiconductor patterns by removing a portion of each of the semiconductor layers, forming a hole extending through the plurality of semiconductor patterns, removing a portion of each of the second insulating layers through the hole to form a plurality of recesses, which are horizontally extend from the hole, forming a gate electrode in the hole and the plurality of recesses, forming a plurality of bit lines electrically connected to first ends of the plurality of semiconductor patterns, respectively, and forming a plurality of data storing elements electrically connected to second ends of the plurality of semiconductor patterns.

BRIEF DESCRIPTION OF DRAWINGS

Some example embodiments will be more clearly understood from the following description taken in conjunction with the accompanying drawings. The accompanying drawings represent non-limiting, example embodiments of the inventive concept as described herein.

FIGS. 4A to 4D are sectional views respectively taken along lines A-A', B-B', C-C', and D-D' of FIG. 3.

FIGS. 7B, 9B, 11B, 13B, 15B, 17B, 19B, and 21B are sectional views respectively taken along lines B-B' of FIGS. 6, 8, 10, 12, 14, 16, 18, and 20, respectively.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

Figure 1:
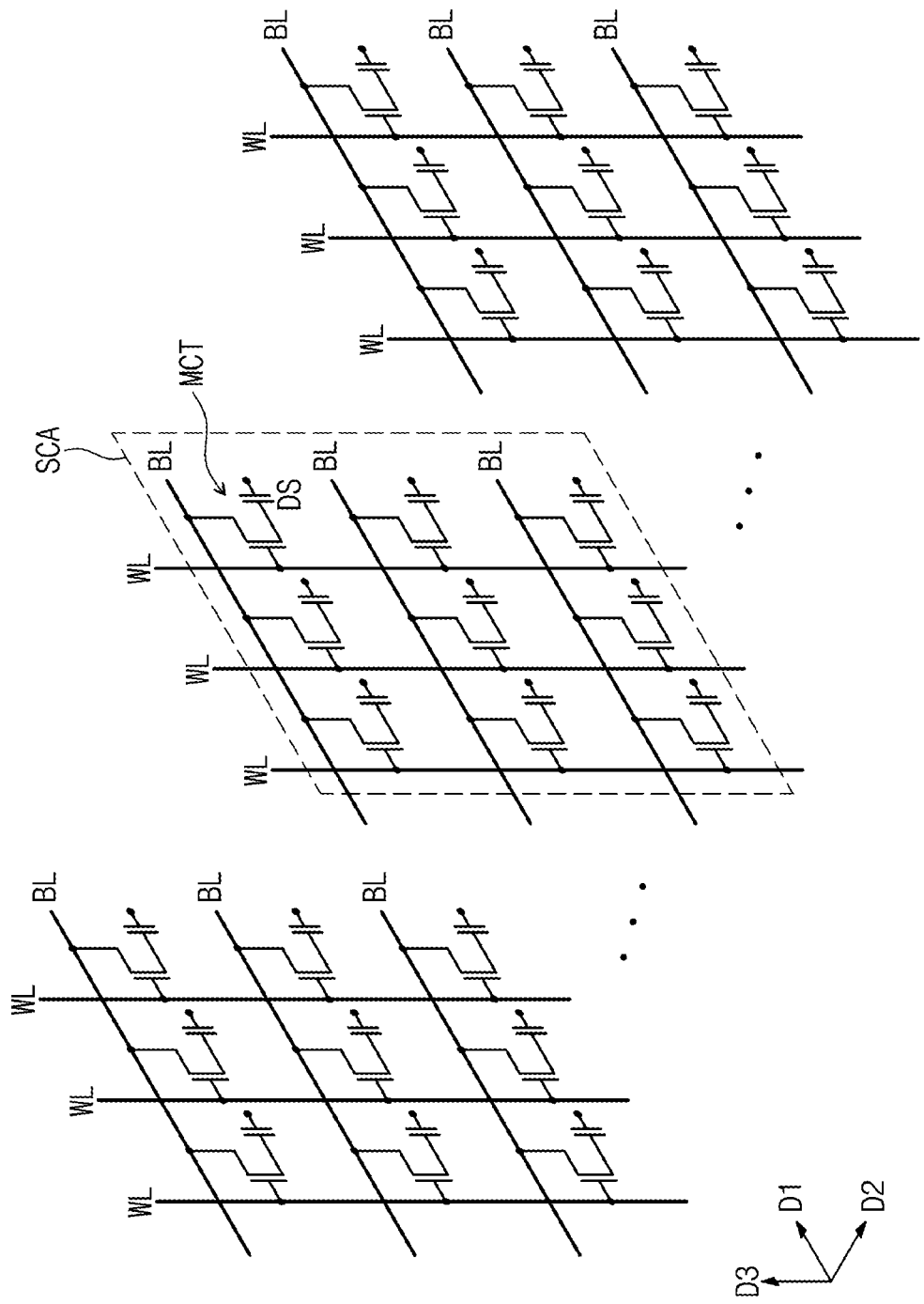
FIG. 1 is a circuit diagram schematically illustrating a cell array of a three-dimensional semiconductor memory device according to some embodiments of the inventive concept.

FIG. 1 is a circuit diagram schematically illustrating a cell array of a three-dimensional semiconductor memory device according to some embodiments of the inventive concept.

Referring to FIG. 1, a cell array of a three-dimensional semiconductor memory device according to some embodiments of the inventive concept may include a plurality of sub-cell arrays SCA. The sub-cell arrays SCA may be arranged in a second direction D2. In some embodiments, the sub-cell arrays SCA may be spaced apart from each other in the second direction D2 as illustrated in FIG. 1.

Each of the sub-cell arrays SCA may include a plurality of bit lines BL, a plurality of word lines WL, and a plurality of memory cell transistors MCT. One memory cell transistor MCT may be disposed between one word line WL and one bit line BL.

The bit lines BL may be conductive patterns (e.g., metal lines), which are disposed on a substrate and are spaced apart from the substrate. The bit lines BL may be extended in a first direction D1. The bit lines BL in each sub-cell array SCA may be spaced apart from each other in a vertical direction (i.e., a third direction D3). In some embodiments, each of the bit lines BL may extend longitudinally in the first direction D1.

The word lines WL may be conductive patterns (e.g., metal lines), which are extended from the substrate in the vertical direction (i.e., the third direction D3). The word lines WL in each sub-cell array SCA may be spaced apart from each other in the first direction D1. In some embodiments, each of the word lines WL may extend longitudinally in the third direction D3.

A gate electrode of the memory cell transistor MCT may be connected to the word line WL, and a source electrode of the memory cell transistor MCT may be connected to the bit line BL. Each of the memory cell transistors MCT may include a data storing element DS. For example, the data storing element DS may be a capacitor, and a drain electrode of the memory cell transistor MCT may be connected to the capacitor.

Figure 2:
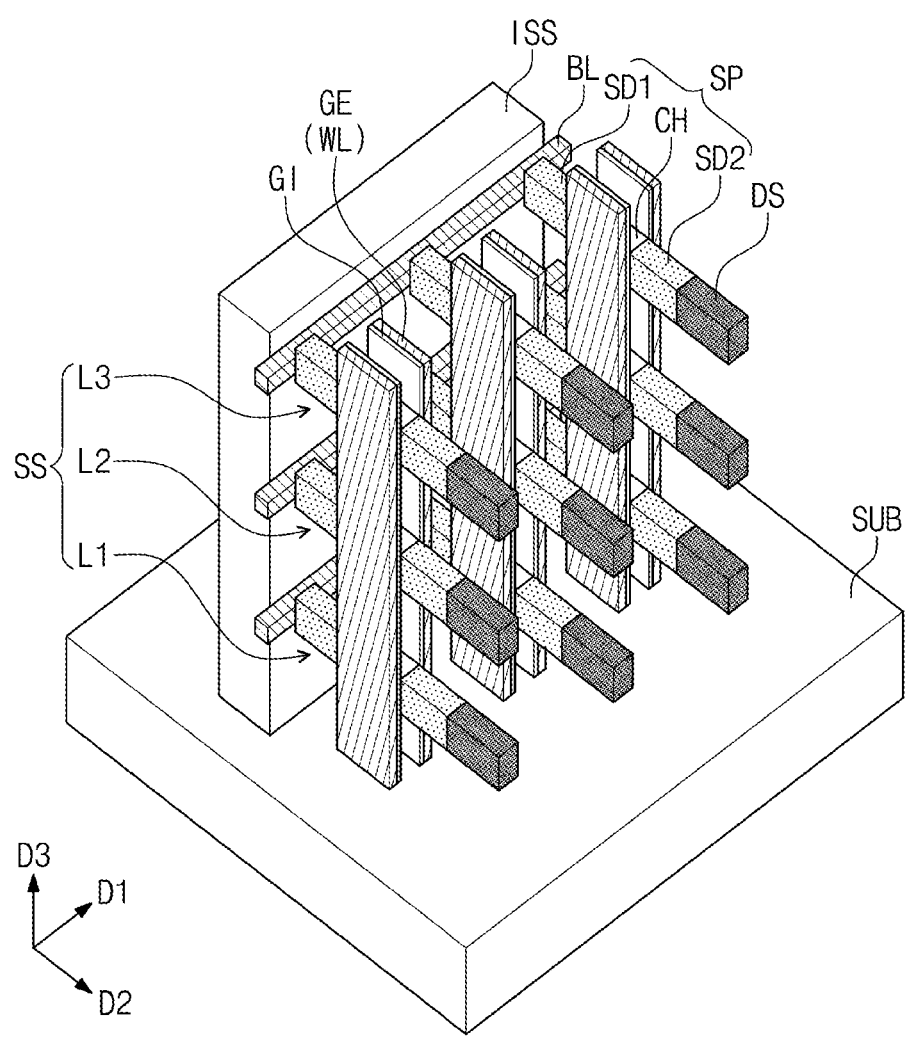
FIG. 2 is a perspective view illustrating a three-dimensional semiconductor memory device according to some embodiments of the inventive concept.

FIG. 2 is a perspective view illustrating a three-dimensional semiconductor memory device according to some embodiments of the inventive concept.

Referring to FIGS. 1 and 2, one of the sub-cell arrays SCA described with reference to FIG. 1 may be provided on a substrate SUB. The substrate SUB may be, for example, a silicon substrate, a germanium substrate, or a silicon-germanium substrate.

In detail, a stack SS including first, second, and third layers L1, L2, and L3 may be provided on the substrate SUB. The first to third layers L1, L2, and L3 of the stack SS may be stacked to be spaced apart from each other in the vertical direction (i.e., in the third direction D3). Each of the first to third layers L1, L2, and L3 may include a plurality of semiconductor patterns SP, a plurality of data storing elements DS, and a bit line BL. The third direction D3 may be a direction that traverses a direction in which an upper surface of the substrate SUB extends as illustrated in FIG. 2. In some embodiments, third direction D3 may be perpendicular to the upper surface of the substrate SUB.

Each of the semiconductor patterns SP may be a pattern having a line-shape, a bar-shape, or pillar-shape extending in the second direction D2. In some embodiments, each of the semiconductor patterns SP may extend longitudinally in the second direction D2. As an example, the semiconductor patterns SP may be formed of or include silicon, germanium, or silicon-germanium. Each of the semiconductor patterns SP may include a channel region CH, a first impurity region SD1, and a second impurity region SD2. The channel region CH may be interposed between the first and second impurity regions SD1 and SD2. The channel region CH may correspond to a channel region of the memory cell transistor MCT described with reference to FIG. 1. The first and second impurity regions SD1 and SD2 may correspond to the source and drain electrodes of the memory cell transistor MCT described with reference to FIG. 1. The second direction D2 may be parallel to the upper surface of the substrate SUB as illustrated in FIG. 2, and the second direction D2 may be referred to as a horizontal direction. The second direction D2 may traverse the third direction D3 and, in some embodiments, the second direction D2 may be perpendicular to the third direction D3.

The first and second impurity regions SD1 and SD2 may be regions of the semiconductor pattern SP that are doped with impurities. In some embodiments, a conductivity type of the first and second impurity regions SD1 and SD2 may be an n-type or p-type. The first impurity region SD1 may be formed adjacent to a first end of the semiconductor pattern SP, and the second impurity region SD2 may be formed adjacent to a second end of the semiconductor pattern SP. The first and second ends may be two opposite end portions of the semiconductor pattern SP.

The data storing elements DS may be respectively connected to the second ends of the semiconductor patterns SP. The data storing elements DS may be respectively connected to the second impurity regions SD2 of the semiconductor patterns SP. The data storing elements DS may be memory elements, which are used to store data. Each of the data storing elements DS may be a memory element using a capacitor, a memory element using a magnetic tunnel junction pattern, or a memory element using a variable resistance material (e.g., a phase-change material). In some embodiments, each of the data storing elements DS may be a capacitor.

Each of the bit lines BL may be a pattern having a line-shape or a bar-shape extending in the first direction D1. The bit lines BL may be stacked to be spaced apart from each other in the third direction D3. The bit lines BL may be formed of or include a conductive material. For example, the conductive material may be one of doped semiconductor materials (e.g., doped silicon or doped germanium), conductive metal nitrides (e.g., titanium nitride or tantalum nitride), metallic materials (e.g., tungsten, titanium, or tantalum), and metal-semiconductor compounds (e.g., tungsten silicide, cobalt silicide, or titanium silicide). The bit lines BL may be the bit lines BL described with reference to FIG. 1. The first direction D1 may be parallel to the upper surface of the substrate SUB as illustrated in FIG. 2, and the first direction D1 may be referred to as a horizontal direction. The first direction D1 may traverse the second direction D2 and, in some embodiments, the first direction D1 may be perpendicular to the second direction D2. The first direction D1 may traverse the third direction D3 and, in some embodiments, the first direction D1 may be perpendicular to the third direction D3.

Hereinafter, the first layer L1 will be described in more detail as an example of the first to third layers L1, L2, and L3. The semiconductor patterns SP in the first layer L1 may be arranged to be spaced apart from each other in the first direction D1. The semiconductor patterns SP in the first layer L1 may be positioned at the same level (e.g., a first level). The bit line BL in the first layer L1 may be connected to the first end of each of the semiconductor patterns SP of the first layer L1. In some embodiments, the bit line BL may be directly connected to the first impurity regions SD1. In some embodiments, the bit line BL may be electrically connected to the first impurity region SD1 through metal silicide patterns. The second layer L2 and the third layer L3 may be configured to have features substantially the same as or similar to those of the first layer L1 described above.

Gate electrodes GE may be provided on the substrate SUB to penetrate the stack SS. The gate electrodes GE may be patterns having a line-shape or a pillar-shape extending in the third direction D3. In some embodiments, each of the gate electrodes GE may extend longitudinally in the third direction D3 as illustrated in FIG. 2. The gate electrodes GE may be arranged in the first direction D1. In some embodiments, the gate electrodes GE may be spaced apart from each other in the first direction D1 as illustrated in FIG. 2. The gate electrode GE may be disposed adjacent to the channel region CH of the semiconductor pattern SP. A gate insulating layer GI may be interposed between the gate electrode GE and the channel region CH.

The gate insulating layer GI may be a single-layered structure or multi-layered structure that is formed of or include, for example, at least one of high-k dielectric materials, silicon oxide, silicon nitride, or silicon oxynitride. In some embodiments, the high-k dielectric materials may include at least one of hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, or lead zinc niobate. The gate electrodes GE may be formed of or include a conductive material, and the conductive material may be, for example, one of doped semiconductor materials, conductive metal nitrides, metallic materials, and metal-semiconductor compounds. The gate electrodes GE may be the word lines WL described with reference to FIG. 1.

An insulating structure ISS may be provided on the substrate SUB to extend along a side surface of the stack SS and in the first direction D1. Side surfaces of the semiconductor patterns SP may be in contact with the insulating structure ISS. The insulating structure ISS may be formed of or, for example, include at least one of silicon oxide, silicon nitride, or silicon oxynitride.

Although not shown, empty spaces in the stack SS may be filled with an insulating material. The insulating material may include at least one of, for example, silicon oxide, silicon nitride, or silicon oxynitride.

Figure 3:
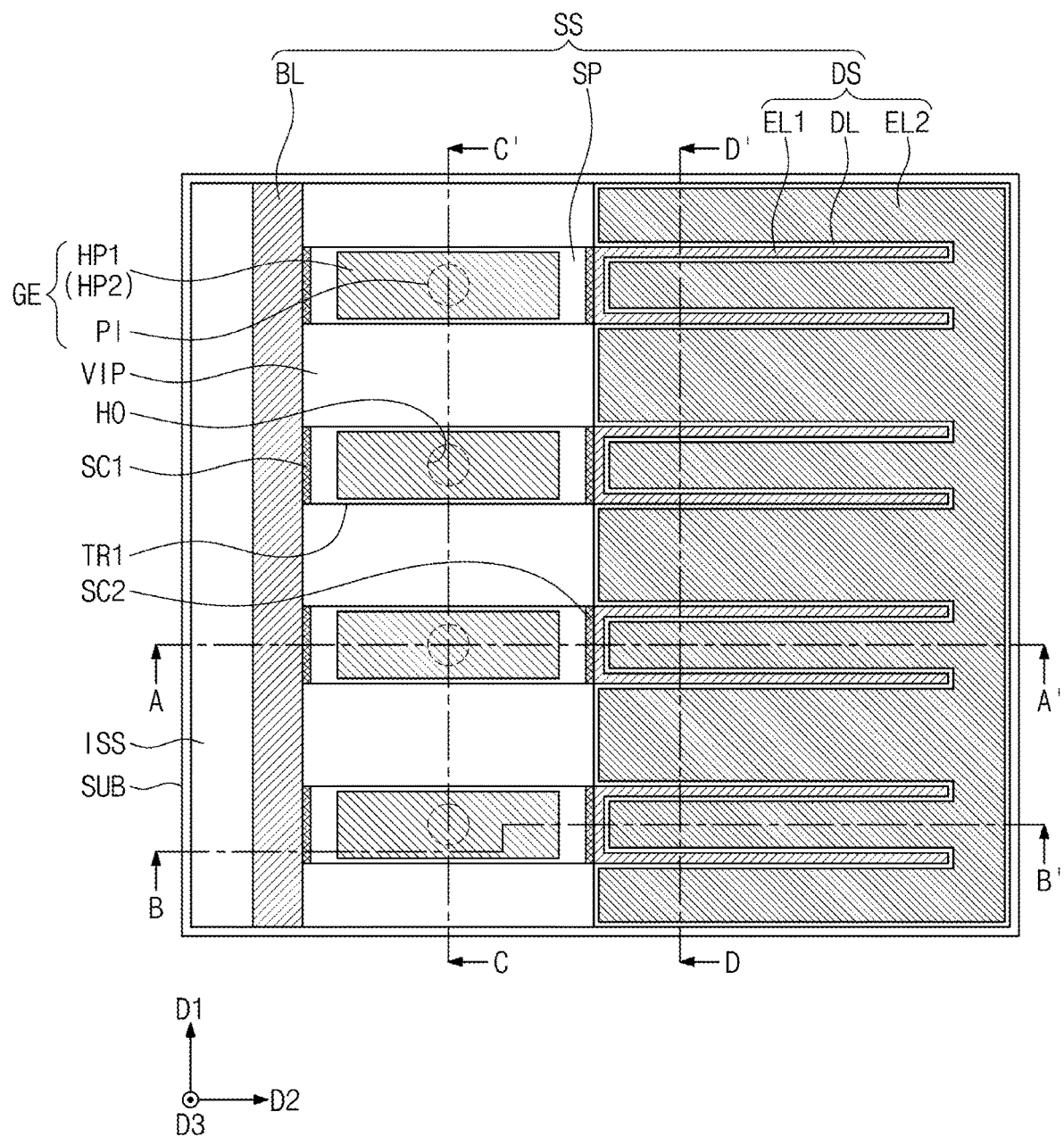
FIG. 3 is a plan view illustrating a three-dimensional semiconductor memory device according to some embodiments of the inventive concept.
Figure 4A:
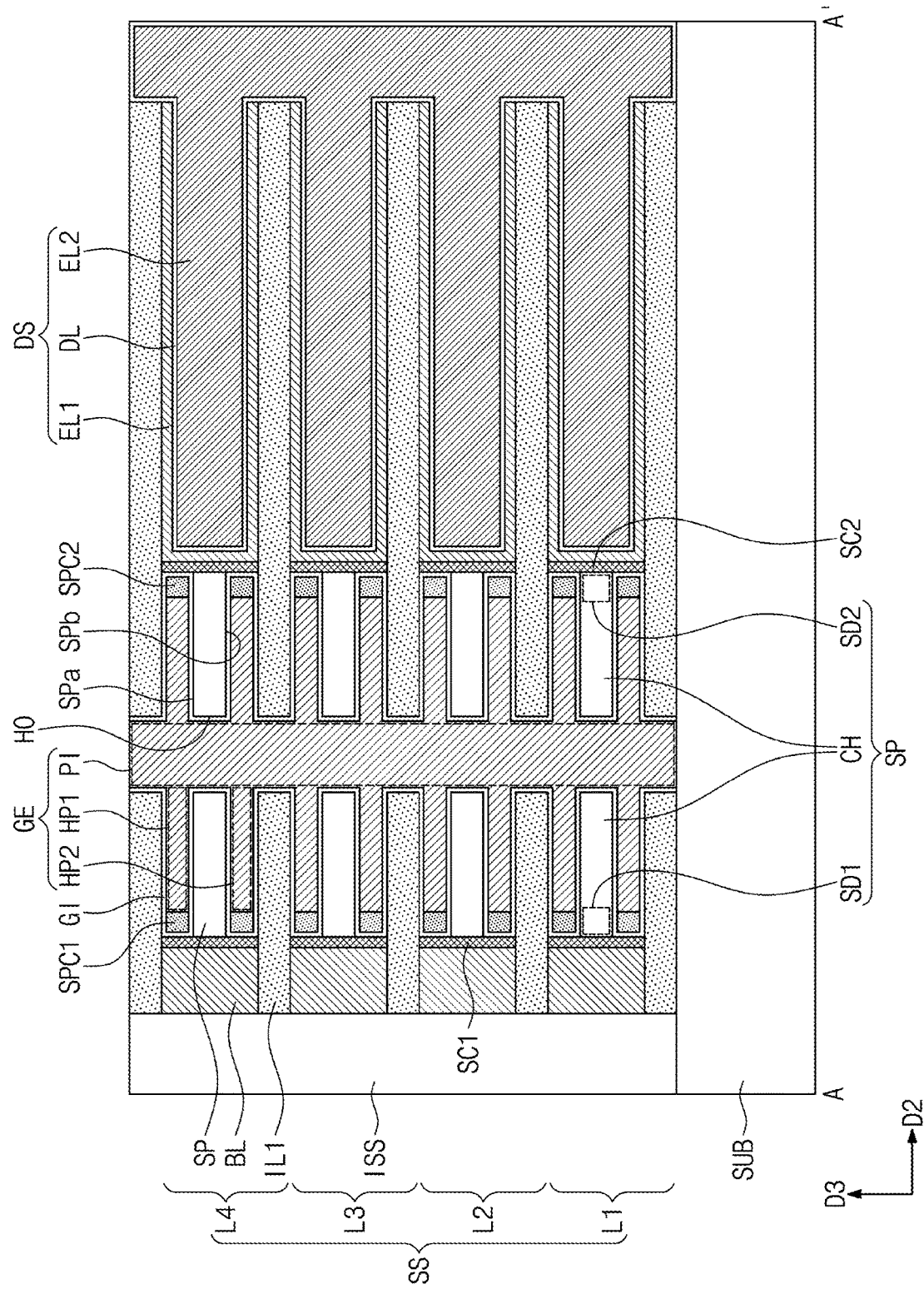
Figure 4B:
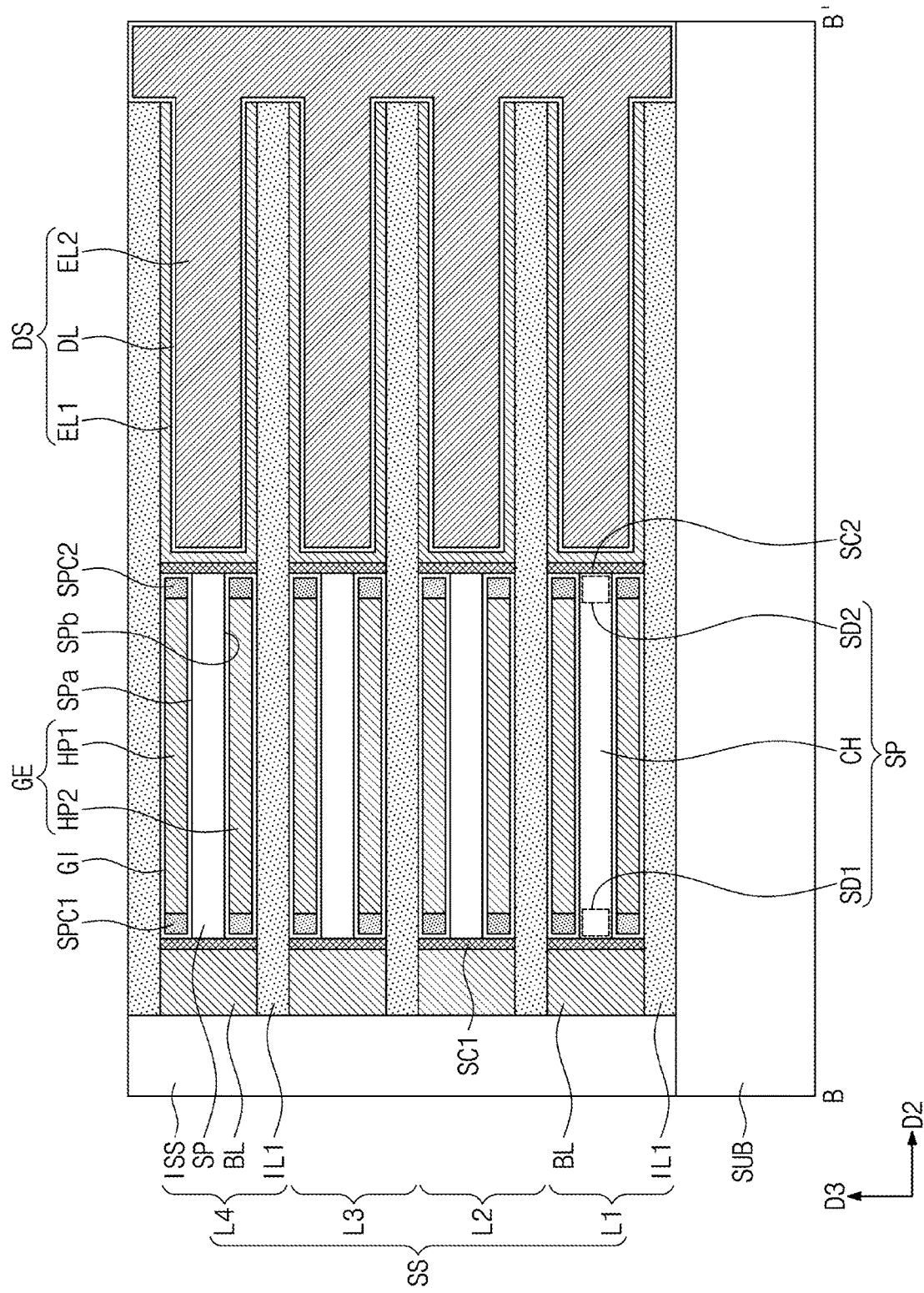
Figure 4C:
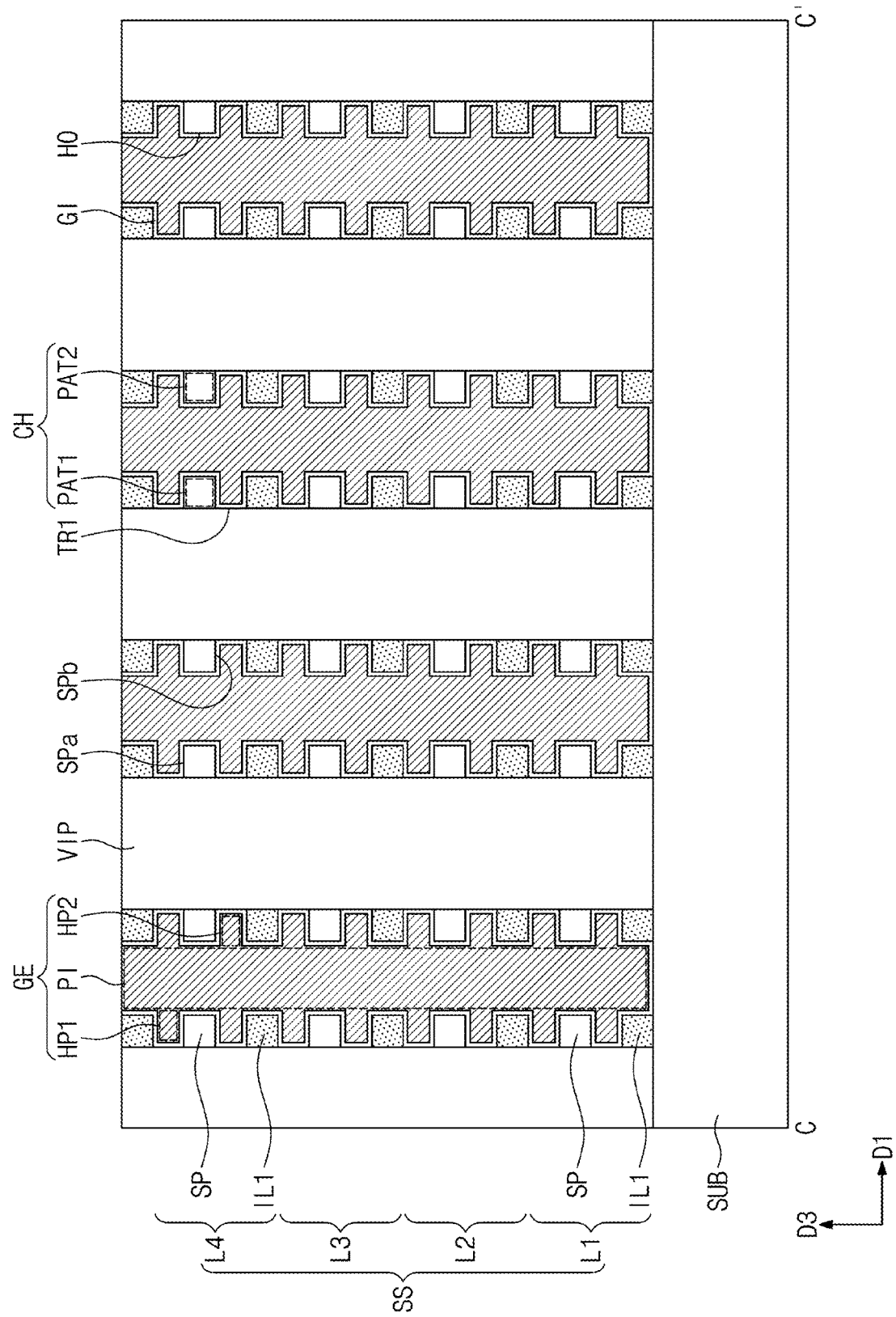
Figure 5:
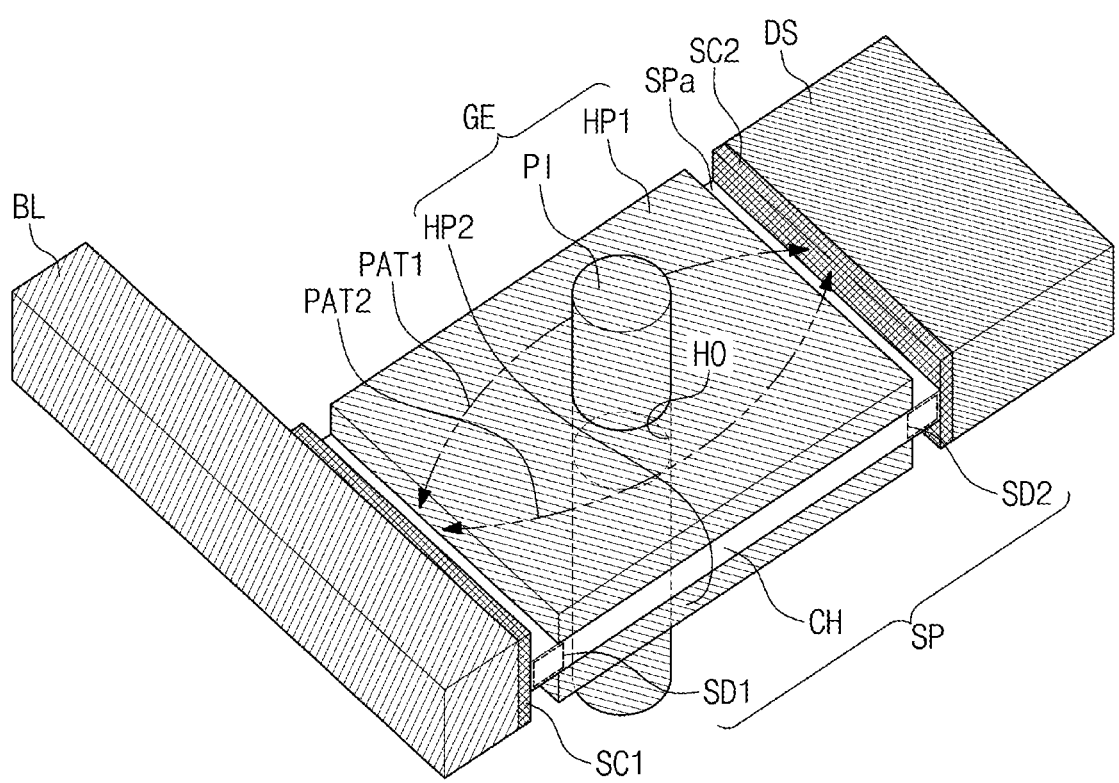
FIG. 5 is a perspective view schematically illustrating a memory cell of FIG. 3.

FIG. 3 is a plan view illustrating a three-dimensional semiconductor memory device according to some embodiments of the inventive concept. FIGS. 4A to 4D are sectional views respectively taken along lines A-A', B-B', C-C', and D-D' of FIG. 3. FIG. 5 is a perspective view schematically illustrating a memory cell of FIG. 3. For concise description, an element previously described with reference to FIGS. 1 and 2 will be identified by the same reference number without repeating an overlapping description thereof, and differences from the embodiments already described may be described in more detail below.

Referring to FIGS. 3, 4A to 4D, and 5, the stack SS may be provided on the substrate SUB. The stack SS may be extended in the first direction D1. Although not shown, a plurality of the stacks SS may be arranged in the second direction D2.

The stack SS may include first, second, third, and fourth layers L1, L2, L3, and L4, which are sequentially stacked on the substrate SUB. Each of the first to fourth layers L1-L4 may include a first insulating layer IL1, the semiconductor pattern SP, and the bit line BL. Although four layers (i.e., the first to fourth layers L1-L4) are illustrated herein, one or more layers may be additionally stacked on the fourth layer L4.

The semiconductor pattern SP and the bit line BL may be provided on the first insulating layer IL1. The semiconductor pattern SP and the bit line BL may be disposed side by side on the first insulating layer IL1. The first insulating layer IL1 may separate the bit line BL in an upper layer from the bit line BL in a lower layer in the vertical direction (i.e., the third direction D3). The first insulating layer IL1 may separate two bit lines BL that are adjacent to each other and are spaced apart from each other in the third direction D3.

The bit line BL in each of the first to fourth layers L1-L4 may be extended in the first direction D1. The bit line BL may be positioned at the same level as the semiconductor pattern SP. A side surface of the bit line BL may face a side surface of the semiconductor pattern SP.

The bit line BL may be formed of or include, for example, at least one of doped semiconductor materials, conductive metal nitrides, metals, or metal-semiconductor compounds. The semiconductor pattern SP may be formed of or include, for example, a semiconductor material (e.g., silicon, germanium, or silicon-germanium). For example, the first insulating layer IL1 may be selected from the group consisting of a silicon oxide layer, a silicon nitride layer, a silicon oxynitride layer, a carbon-containing silicon oxide layer, a carbon-containing silicon nitride layer, and a carbon-containing silicon oxynitride layer.

In some embodiments, a plurality of the semiconductor patterns SP may be provided in each of the first to fourth layers L1-L4. The semiconductor patterns SP in each of the first to fourth layers L1-L4 may be bar-shaped patterns, which are extended from the bit line BL in the second direction D2. Each of the semiconductor patterns SP may include the channel region CH, the first impurity region SD1, and the second impurity region SD2. The channel region CH may be interposed between the first and second impurity regions SD1 and SD2. The bit line BL may be electrically connected to the first impurity region SD1 of the semiconductor pattern SP.

First trenches TR1 may be defined to penetrate the stack SS. The first trench TR1 may be positioned between each adjacent pair of the semiconductor patterns SP. A vertical insulating layer VIP may be provided to fill each of the first trenches TR1. The vertical insulating layer VIP may cover side surfaces of the semiconductor patterns SP, which are stacked on the substrate SUB. The vertical insulating layer VIP may also cover side surfaces of the stacked first insulating layers IL1. The vertical insulating layer VIP may be formed of or include, for example, at least one of silicon oxide, silicon nitride, or silicon oxynitride.

The gate electrode GE may be provided to penetrate the semiconductor patterns SP, which are vertically stacked on the substrate SUB. In some embodiments, a plurality of the gate electrodes GE may be arranged at a constant pitch in the first direction D1. In some embodiments, the gate electrodes GE may be spaced apart from each other by a uniform distance in in the first direction D1 as illustrated in FIG. 3. In other words, the plurality of the gate electrodes GE may penetrate the stack SS. In some embodiments, each of the gate electrodes GE may extend through the stack SS as illustrated in FIG. 4A. In some embodiments, each of the gate electrodes GE may constitute a respective one word line WL of the word lines WL.

Each of the gate electrodes GE may include a pillar portion PI and first and second horizontally-extended portions HP1 and HP2, which are horizontally extended from the pillar portion PI. The pillar portion PI may penetrate the semiconductor patterns SP, which are vertically stacked on the substrate SUB. In detail, a hole HO may be defined to penetrate the semiconductor patterns SP and first insulating layers IL1, which are alternately stacked on the substrate SUB. The pillar portion PI may be provided in the hole HO. The pillar portion PI may be extended from the top surface of the substrate SUB in the third direction D3. The pillar portion PI may have a circular or elliptical shape, when viewed in a plan view. The term "pillar" as used herein refers to a shape that includes a bottom surface and a vertical portion extending from the bottom surface in a vertical direction. The vertical portion of the element may or may not have a side perpendicular to the bottom surface. The pillar portion PI may be a vertical portion of the gate electrode GE.

The semiconductor pattern SP may have a first surface SPa and a second surface SPb, which are opposite to each other. For example, the first surface SPa may be a top surface of the semiconductor pattern SP, and the second surface SPb may be a bottom surface of the semiconductor pattern SP.

The first horizontally-extended portion HP1 of the gate electrode GE may be provided on the first surface SPa of the semiconductor pattern SP, and the second horizontally-extended portion HP2 of the gate electrode GE may be provided on the second surface SPb of the semiconductor pattern SP. The first horizontally-extended portion HP1 may be interposed between the semiconductor pattern SP and the first insulating layer IL1 thereon, and the second horizontally-extended portion HP2 may be interposed between the semiconductor pattern SP and the first insulating layer IL1 thereunder. The semiconductor pattern SP may be sandwiched between the first and second horizontally-extended portions HP1 and HP2, which are respectively provided thereon and thereunder.

The first horizontally-extended portion HP1 may be overlapped with the semiconductor pattern SP, when viewed in a plan view. The second horizontally-extended portion HP2 may be overlapped with the semiconductor pattern SP, when viewed in a plan view. Each of the first and second horizontally-extended portions HP1 and HP2 may be a bar-shaped structure extending in the second direction D2, when viewed in a plan view.

A width of the first horizontally-extended portion HP1 in the second direction D2 may be substantially equal to a width of the second horizontally-extended portion HP2 in the second direction D2. The width of the first horizontally-extended portion HP1 in the second direction D2 may be narrower than a width of the semiconductor pattern SP in the second direction D2.

Referring to FIG. 5, the channel region CH of the semiconductor pattern SP may be interposed between the first and second horizontally-extended portions HP1 and HP2. A transistor of a memory cell according to some embodiments of the inventive concept may have a double-gate structure, in which the first and second horizontally-extended portions HP1 and HP2 are respectively disposed on and below the channel region CH. The channel region CH of the semiconductor pattern SP may surround the pillar portion PI. The memory cell transistor according to some embodiments of the inventive concept may have a channel-all-around gate structure, in which the channel region CH surrounds the pillar portion PI. In other words, the memory cell transistor may have a hybrid gate structure, in which the double-gate structure and the channel-all-around gate structure are combined. Both the first and second horizontally-extended portions HP1 and HP2 may function as a gate of the channel region CH disposed therebetween.

In the memory cell transistor according to some embodiments of the inventive concept, the channel region CH may include a first path PAT1 and a second path PAT2, which are used for conduction of carriers between the first impurity region SD1 and the second impurity region SD2. In other words, the carriers may detour around the pillar portion PI of the gate electrode GE to transfer from the first impurity region SD1 to the second impurity region SD2 or vice versa.

Since the memory cell transistor according to some embodiments of the inventive concept has the hybrid gate structure, in which the double-gate structure and the channel-all-around gate structure are combined, a physical state of the channel region CH may be easily controlled by the gate electrode GE. Thus, electrical characteristics of the semiconductor memory device may be improved.

Referring back to FIGS. 3 and 4A to 4D, the gate insulating layer GI may be interposed between each of the gate electrodes GE and each of the semiconductor patterns SP. The gate insulating layer GI may be a single-layered or multi-layered structure that is formed of or include, for example, at least one of high-k dielectric materials, silicon oxide, silicon nitride, or silicon oxynitride.

The data storing elements DS may be electrically connected to the semiconductor patterns SP, respectively. Each of the data storing elements DS may include a first electrode EL1, a dielectric layer DL, and a second electrode EL2. The data storing elements DS of the stack SS may share one dielectric layer DL and one second electrode EL2. In other words, a plurality of the first electrodes EL1 may be provided in the stack SS, and one dielectric layer DL may cover surfaces of the first electrodes EL1. One second electrode EL2 may be provided on one dielectric layer DL. Each of the first electrodes EL1 may have a cylinder shape with one open end. The second electrode EL2 may be provided to fill the cylindrical inner space of the first electrode ELL "An element A covering a surface of an element B" (or similar language) as used herein means that the element A is on the surface of the element B but does not necessarily mean that the element A covers the surface of the element B entirely. "An element A filling an element B" (or similar language) as used herein means that the element A is in the element B but does not necessarily mean that the element A fills the element B entirely.

Each of the first and second electrodes EL1 and EL2 may be formed of or include, for example, at least one of metallic materials (e.g., titanium, tantalum, tungsten, copper, and aluminum), conductive metal nitrides (e.g., titanium nitride and tantalum nitride), or doped semiconductor materials (e.g., doped silicon and doped germanium). The dielectric layer DL may be formed of or include, for example, at least one of high-k dielectric materials (e.g., hafnium oxide, hafnium silicon oxide, lanthanum oxide, zirconium oxide, zirconium silicon oxide, tantalum oxide, titanium oxide, barium strontium titanium oxide, barium titanium oxide, strontium titanium oxide, lithium oxide, aluminum oxide, lead scandium tantalum oxide, lead zinc niobate, or combinations thereof).

A first silicide pattern SC1 may be interposed between the bit line BL and the semiconductor pattern SP. A second silicide pattern SC2 may be interposed between the semiconductor pattern SP and the first electrode EL1. The bit line BL may be electrically connected to the first impurity region SD1 via the first silicide pattern SC1. The first electrode EL1 may be electrically connected to the second impurity region SD2 via the second silicide pattern SC2. The first and second silicide patterns SC1 and SC2 may be formed of or include, for example, at least one of metal silicides (e.g., cobalt silicide).

First spacers SPC1 may be interposed between the first silicide pattern SC1 and the first and second horizontally-extended portions HP1 and HP2. Second spacers SPC2 may be interposed between the second silicide pattern SC2 and the first and second horizontally-extended portions HP1 and HP2. In other words, the gate electrode GE may be spaced apart from the first silicide pattern SC1 with the first spacers SPC1 and the gate insulating layer GI interposed therebetween. The gate electrode GE may be spaced apart from the second silicide pattern SC2 with the second spacers SPC2 and the gate insulating layer GI interposed therebetween.

The insulating structure ISS may be provided to extend along a side surface of the stack SS and in the first direction D1. The side surfaces of the semiconductor patterns SP may be in contact with the insulating structure ISS. The insulating structure ISS may be formed of or include, for example, at least one of silicon oxide, silicon nitride, or silicon oxynitride.

Figure 11A:
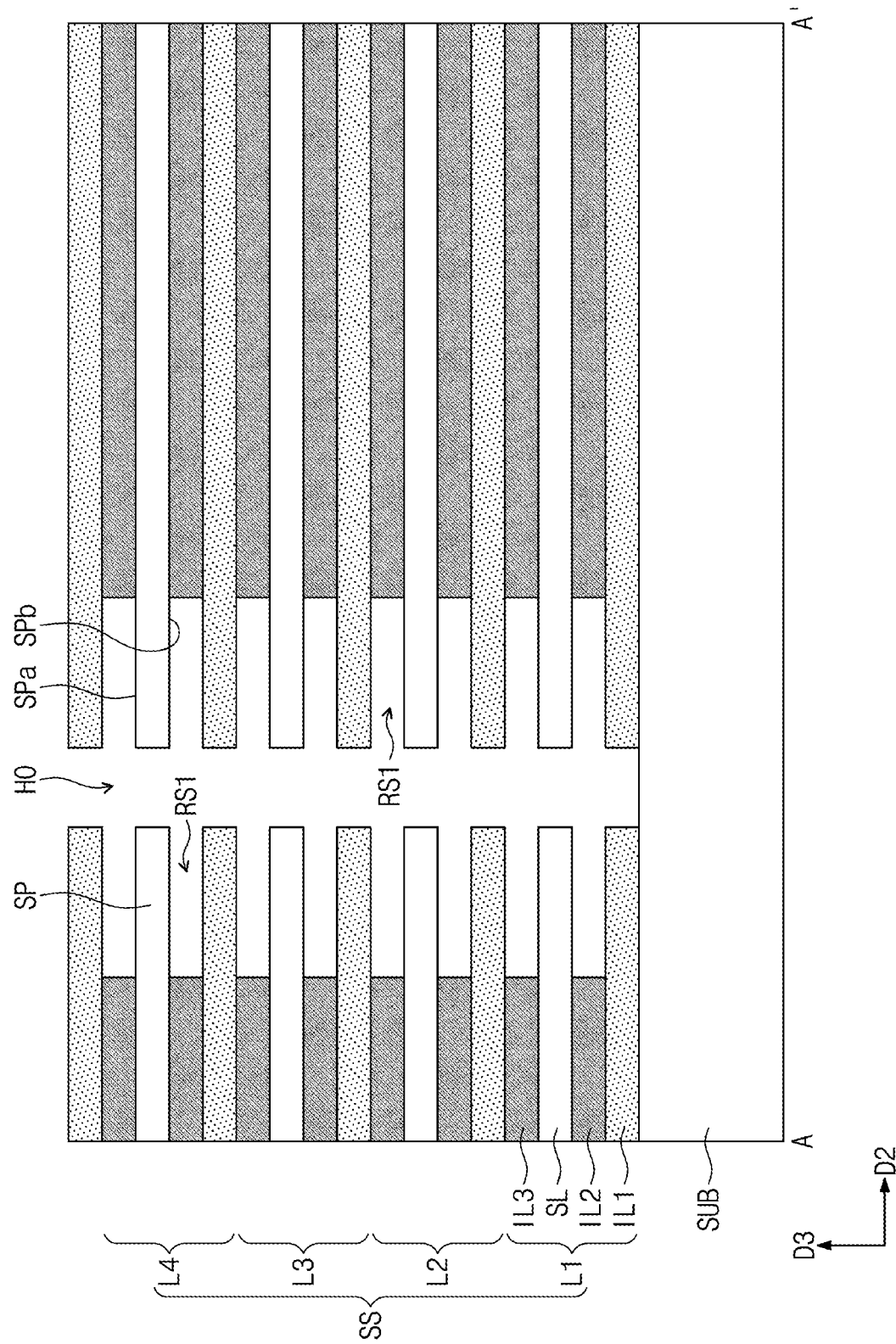
Figure 11B:
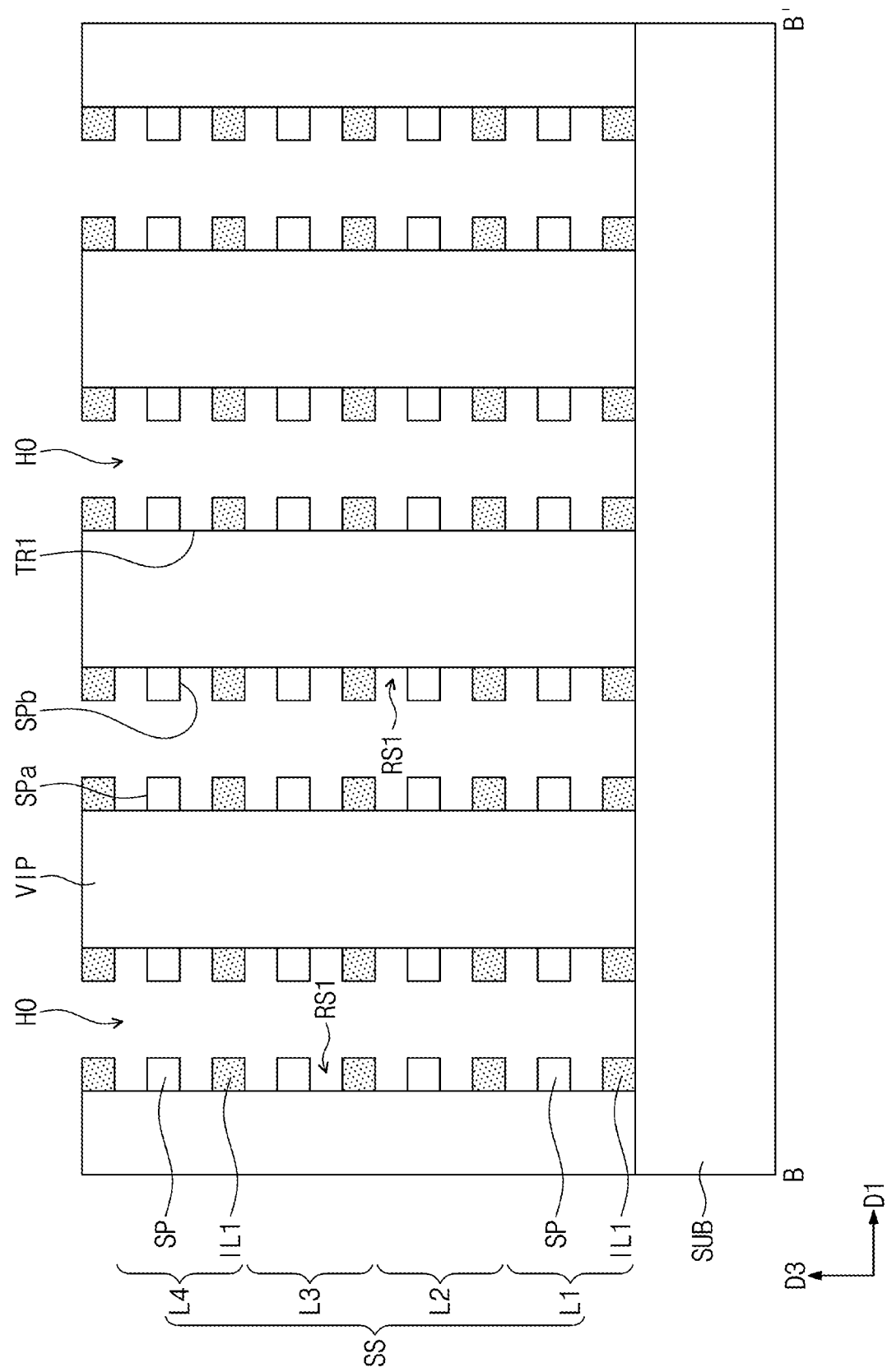
Figure 12:
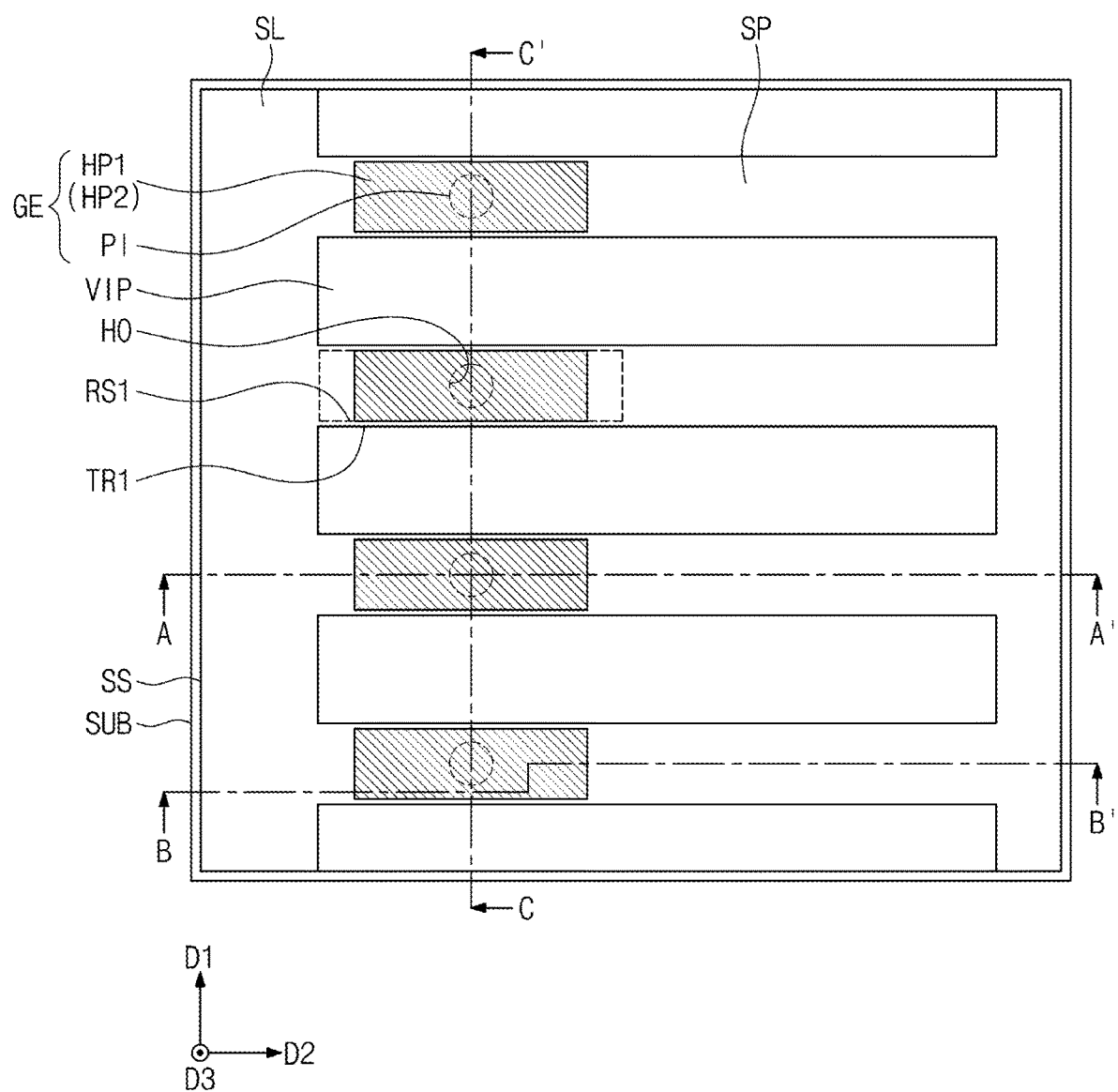
Figure 13A:
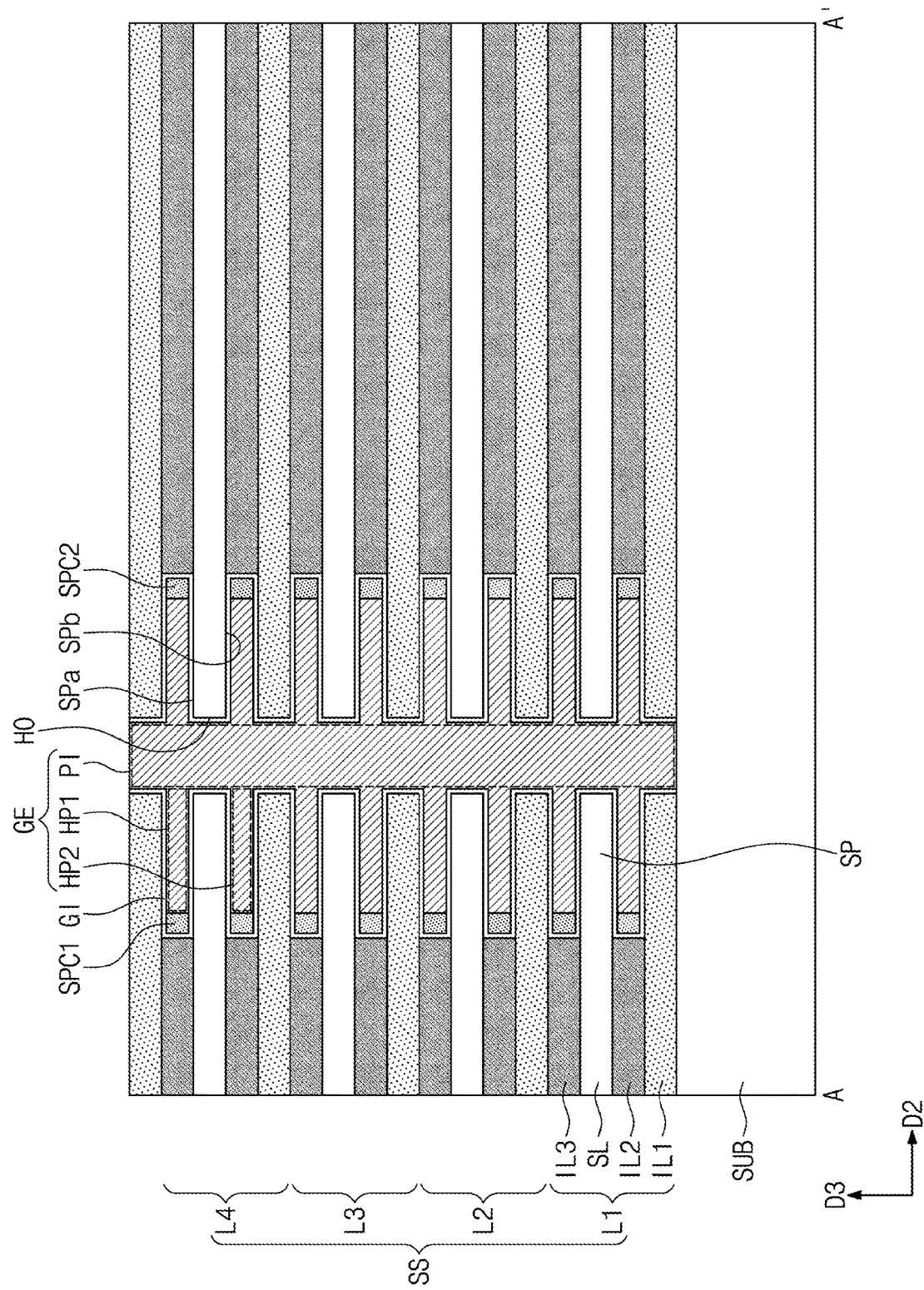
Figure 13B:
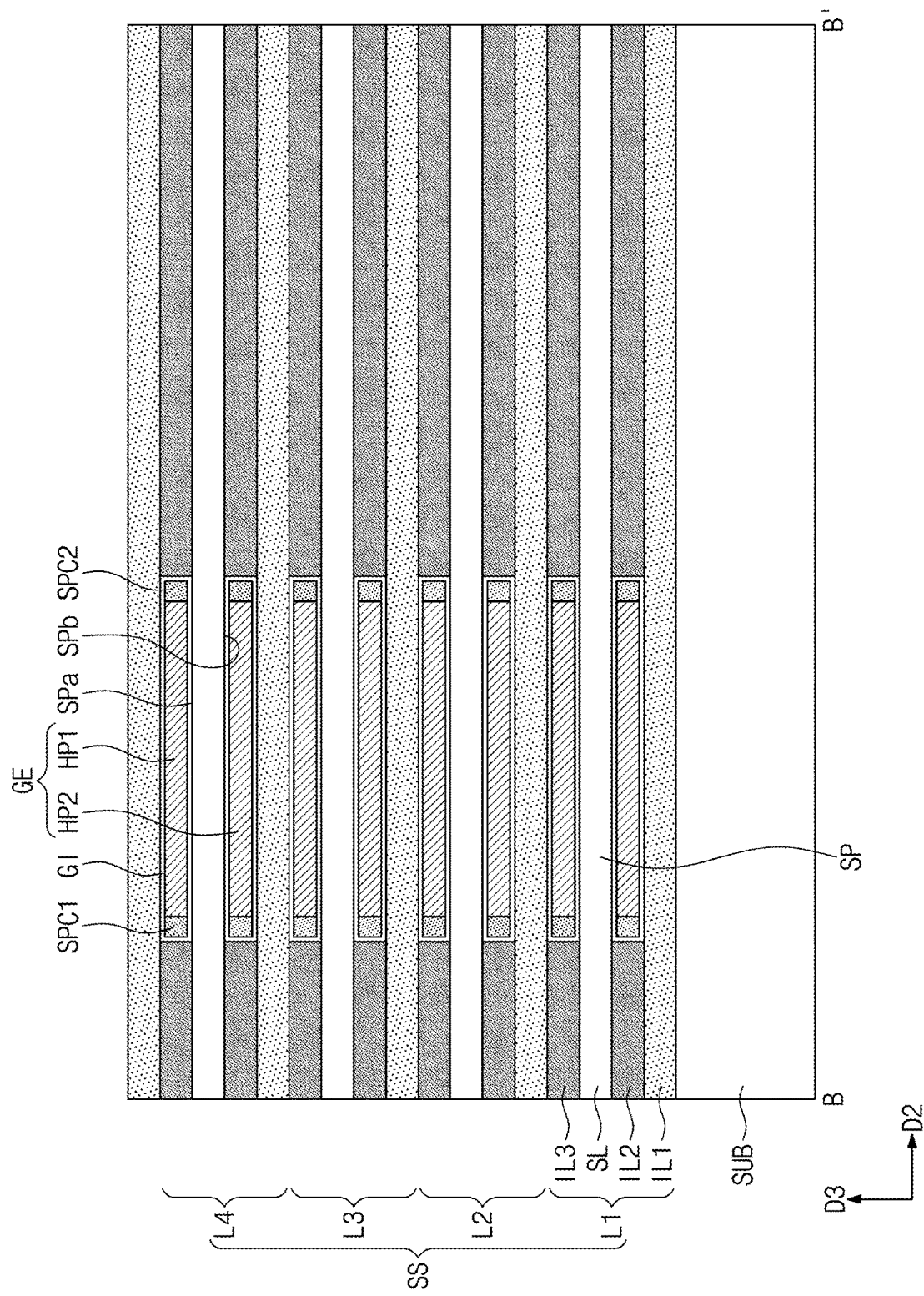
Figure 13C:
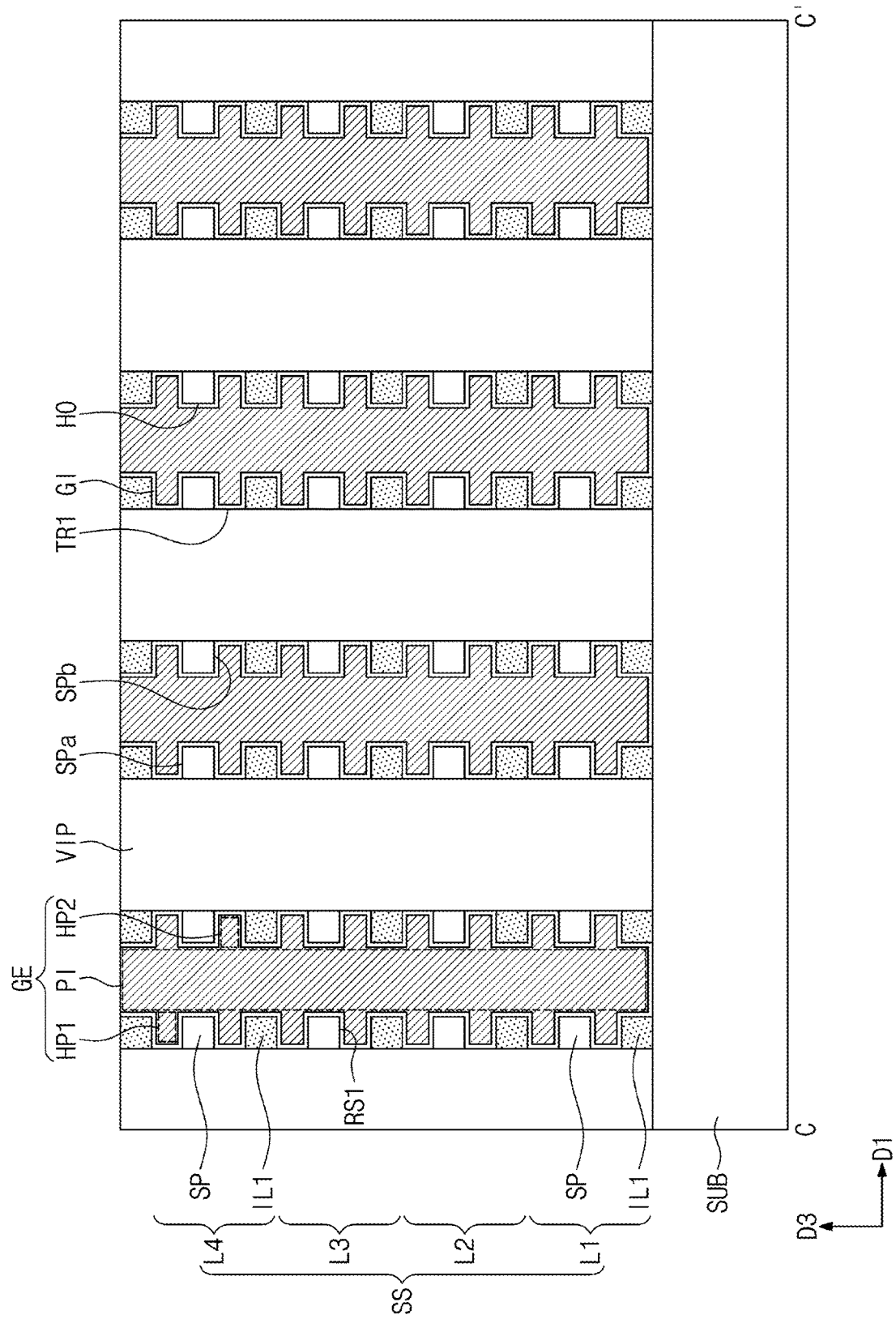
FIGS. 13C, 19C, and 21C are sectional views taken along lines C-C' of FIGS. 12, 18, and 20, respectively.
Figure 21A:
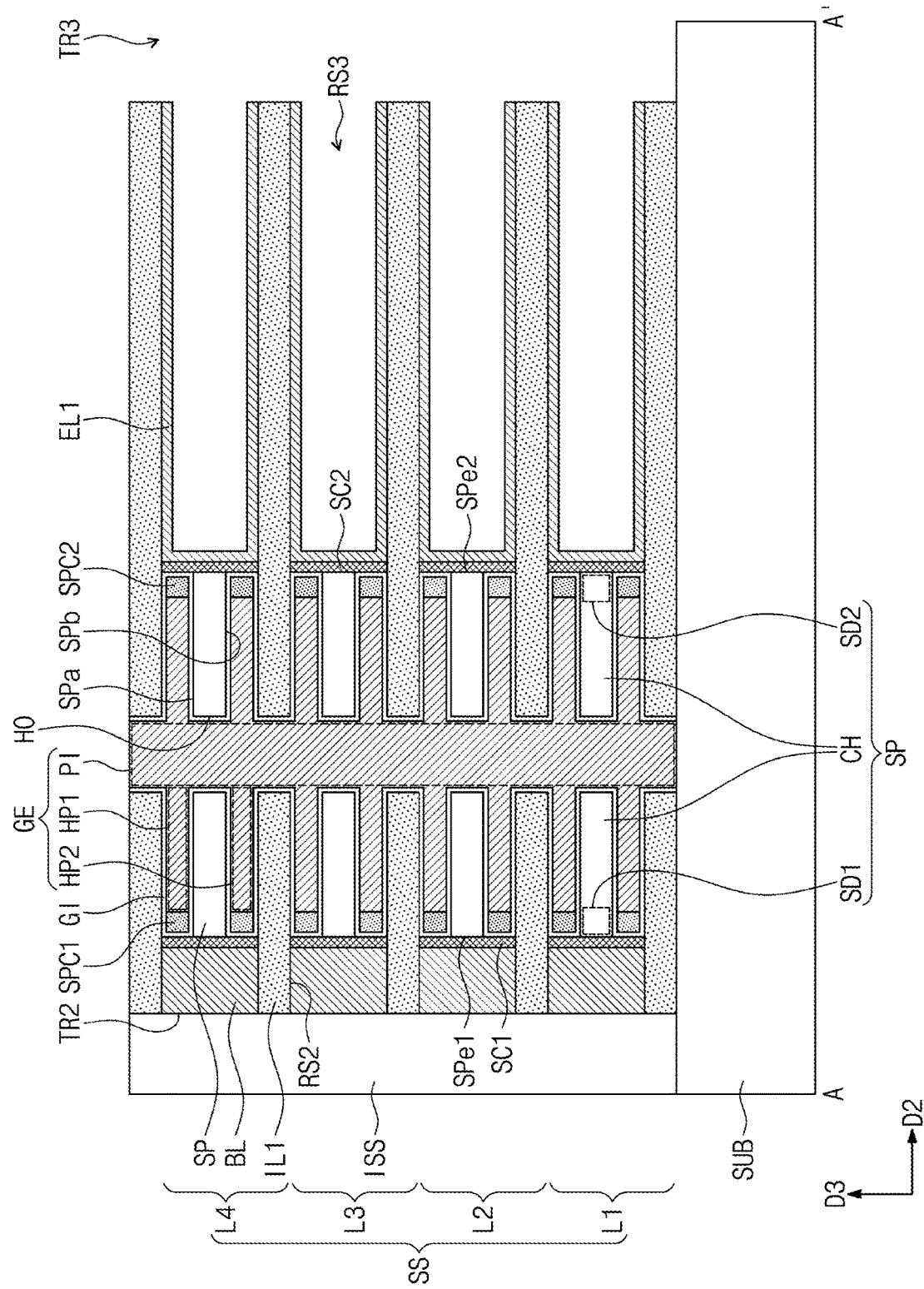
Figure 21C:
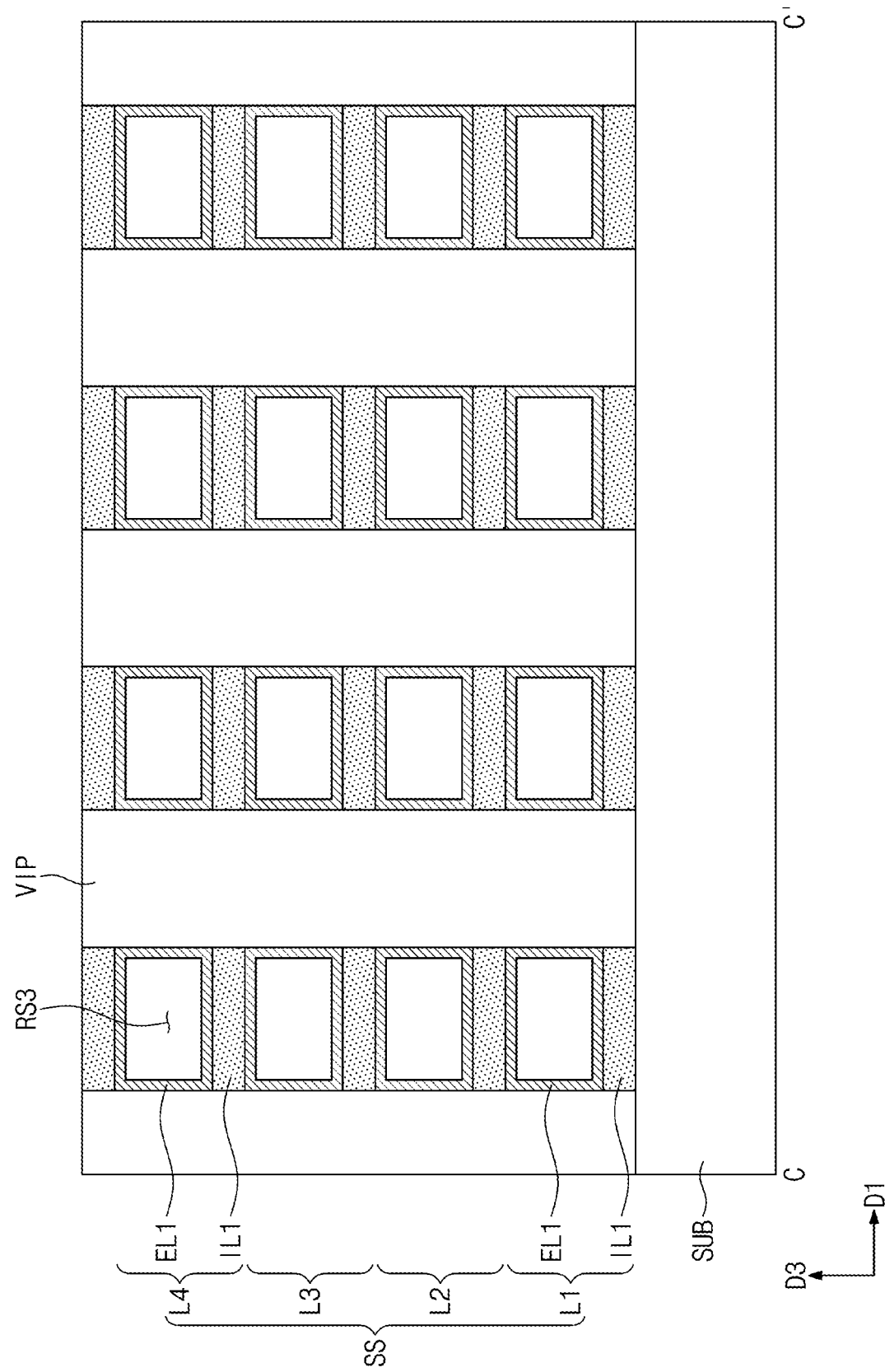

FIGS. 6, 8, 10, 12, 14, 16, 18, and 20 are plan views illustrating a method of fabricating a three-dimensional semiconductor memory device, according to some embodiments of the inventive concept. FIGS. 7A, 9A, 11A, 13A, 15A, 17A, 19A, and 21A are sectional views respectively taken along lines A-A' of FIGS. 6, 8, 10, 12, 14, 16, 18, and 20, respectively. FIGS. 7B, 9B, 11B, 13B, 15B, 17B, 19B, and 21B are sectional views respectively taken along lines B-B' of FIGS. 6, 8, 10, 12, 14, 16, 18, and 20, respectively. FIGS. 13C, 19C, and 21C are sectional views taken along lines C-C' of FIGS. 12, 18, and 20, respectively.

Figure 6:
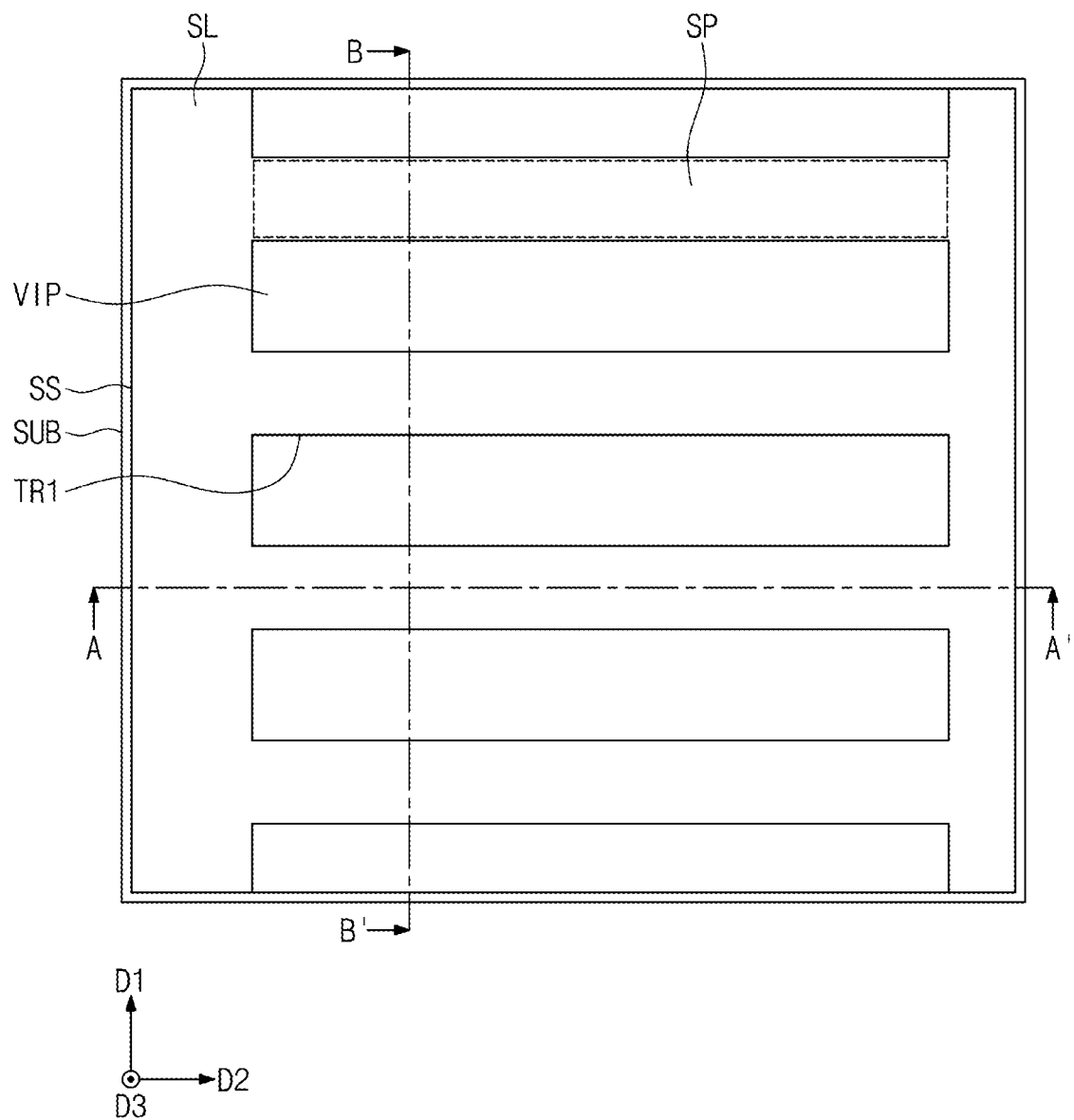
FIGS. 6, 8, 10, 12, 14, 16, 18, and 20 are plan views illustrating a method of fabricating a three-dimensional semiconductor memory device, according to some embodiments of the inventive concept.
Figure 7A:
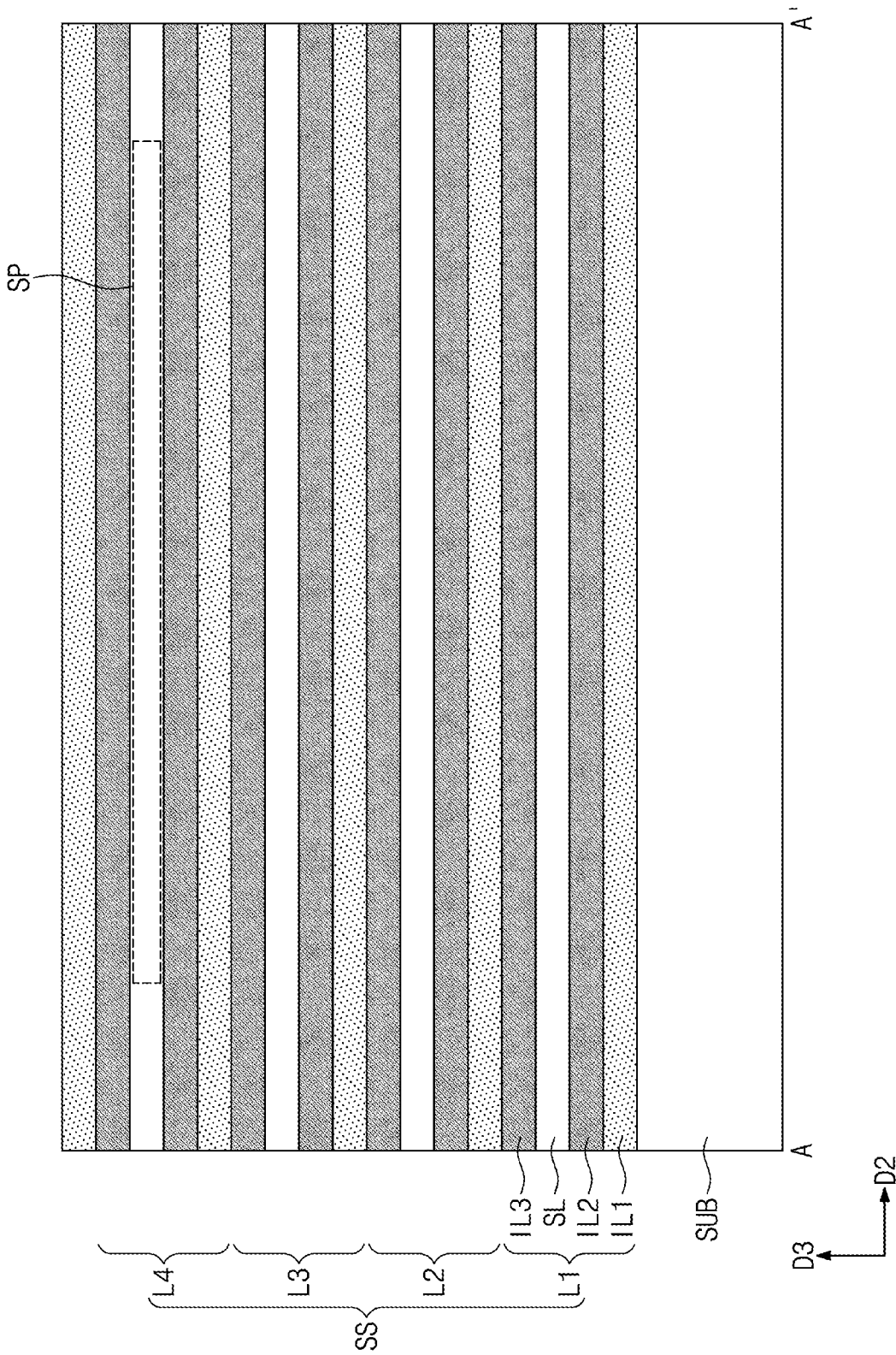
FIGS. 7A, 9A, 11A, 13A, 15A, 17A, 19A, and 21A are sectional views respectively taken along lines A-A' of FIGS. 6, 8, 10, 12, 14, 16, 18, and 20, respectively.
Figure 7B:
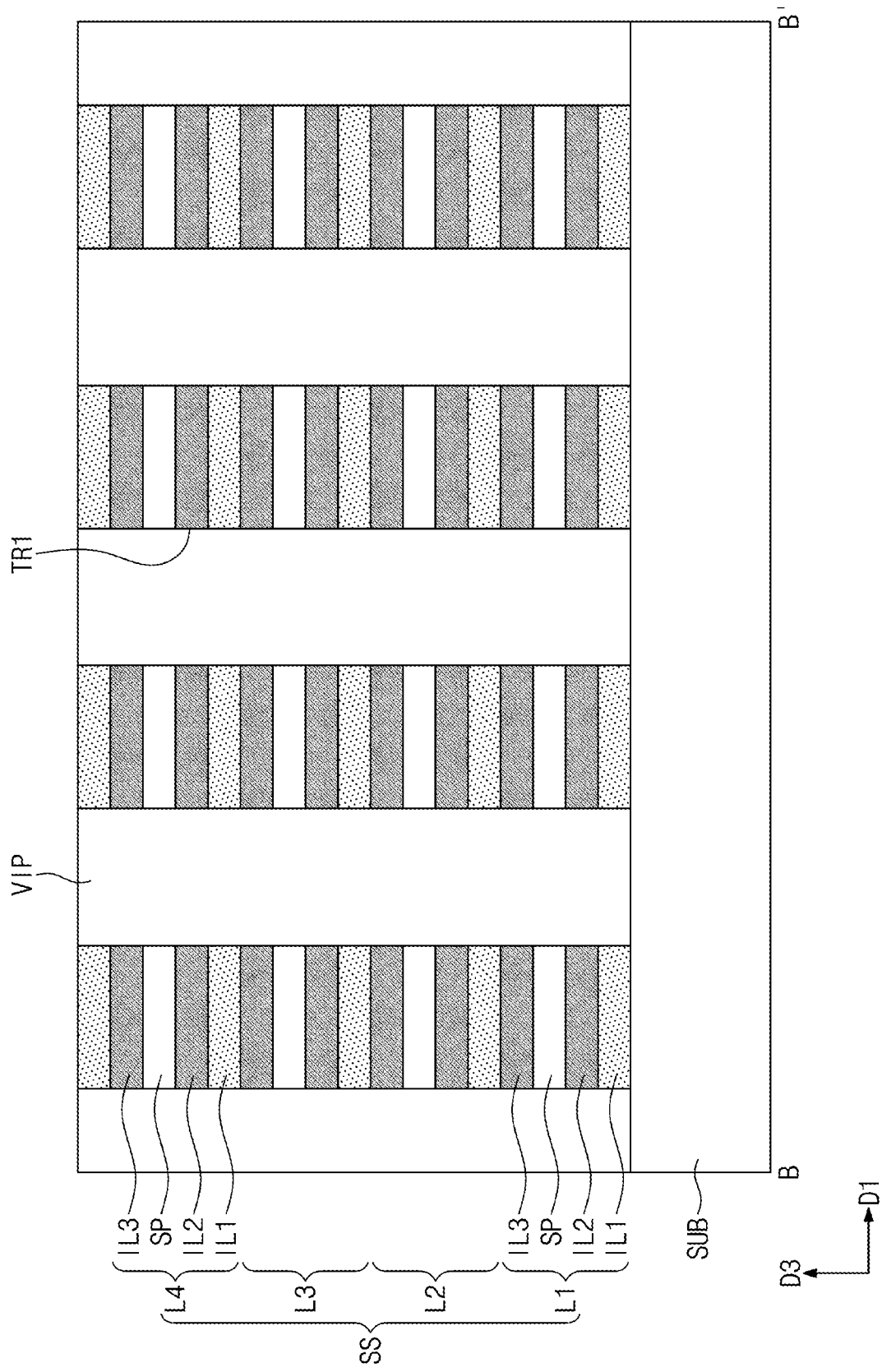

Referring to FIGS. 6, 7A, and 7B, the stack SS may be formed on the substrate SUB. The formation of the stack SS may include sequentially stacking the first to fourth layers L1-L4 on the substrate SUB.

In detail, the formation of each of the first to fourth layers L1-L4 may include forming the first insulating layer IL1, forming a second insulating layer IL2 on the first insulating layer IL1, forming a semiconductor layer SL on the second insulating layer IL2, and forming a third insulating layer IL3 on the semiconductor layer SL. In other words, each of the first to fourth layers L1-L4 may include the first insulating layer IL1, the second insulating layer IL2, the semiconductor layer SL, and the third insulating layer IL3, which are sequentially stacked on the substrate SUB.

The first to third insulating layers IL1, IL2, and IL3 may be, for example, selected from the group consisting of a silicon oxide layer, a silicon nitride layer, a silicon oxynitride layer, a carbon-containing silicon oxide layer, a carbon-containing silicon nitride layer, and a carbon-containing silicon oxynitride layer. In some embodiments, the second insulating layer IL2 may be formed of or include the same material as the third insulating layer IL3. The second and third insulating layers IL2 and IL3 may be formed of or include a material having an etch selectivity with respect to the first insulating layer IL1. For example, the first insulating layer IL1 may include a silicon oxide layer, and the second and third insulating layers IL2 and IL3 may include a silicon nitride layer. The semiconductor layer SL may be formed of or include a semiconductor material (e.g., silicon, germanium, or silicon-germanium).

The stack SS may be patterned to form the first trenches TR1 penetrating (e.g., extending through) the stack SS. The first trenches TR1 may be formed to expose the top surface of the substrate SUB. The first trenches TR1 may be extended in the second direction D2 to be parallel to each other. The first trenches TR1 may be arranged at a constant pitch in the first direction D1. The first trenches TR1 may be spaced apart from each other in the first direction D1 by a uniform distance as illustrated in FIG. 6.

Owing to the first trenches TR1, a plurality of semiconductor patterns SP may be defined in the first to fourth layers L1-L4, respectively. For example, the semiconductor pattern SP may be defined between each adjacent pair of the first trenches TR1. Each of the semiconductor patterns SP may be a bar-shaped pattern extending in the second direction D2. The semiconductor patterns SP may be arranged at a constant pitch in the first direction D1. The semiconductor patterns SP may be spaced apart from each other in the first direction D1 by a uniform distance as illustrated in FIG. 6.

The vertical insulating layer VIP may be formed in the first trenches TR1. The vertical insulating layer VIP may be formed of or include, for example, at least one of silicon oxide, silicon nitride, or silicon oxynitride.

Figure 8:
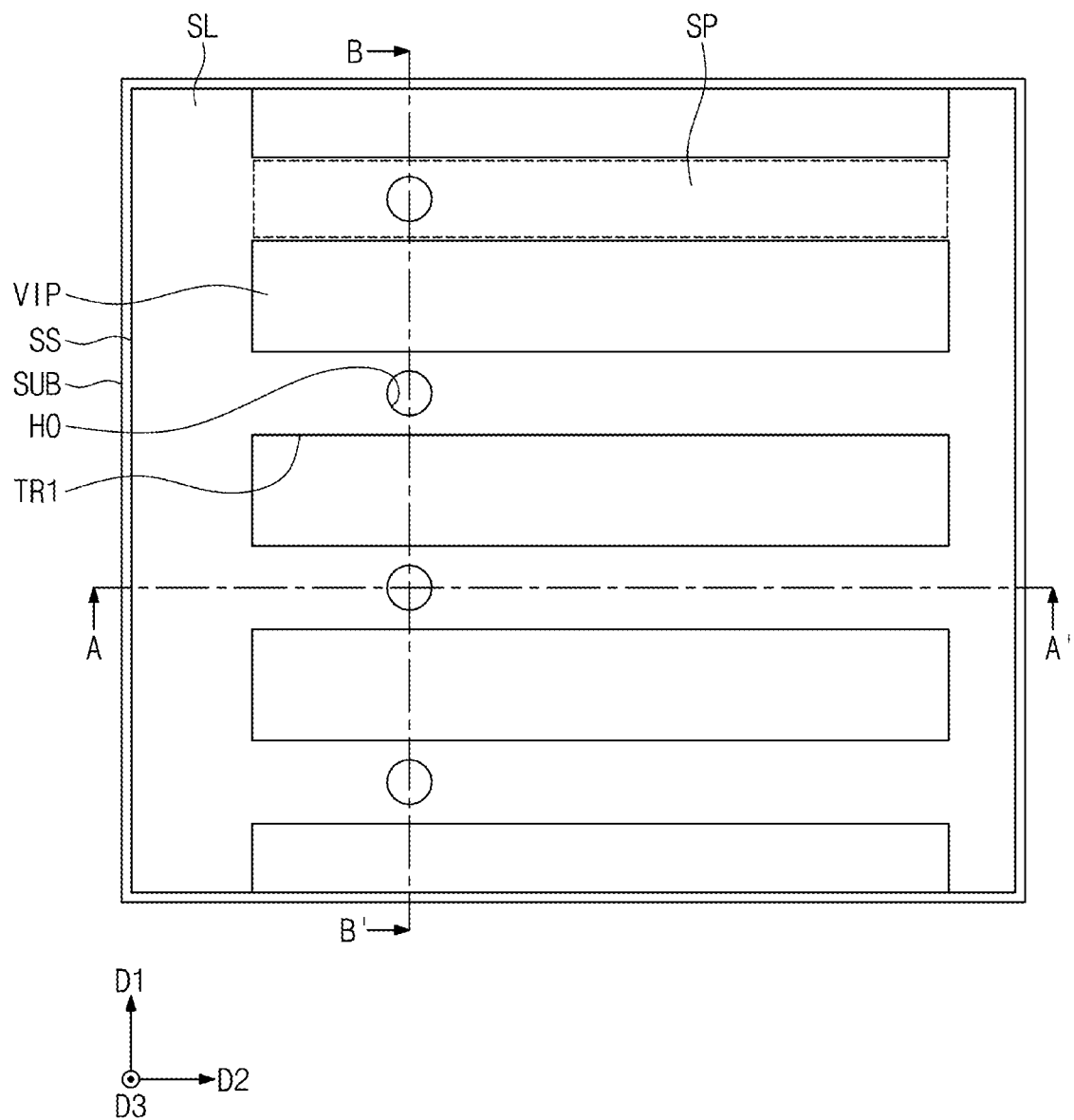
Figure 9A:
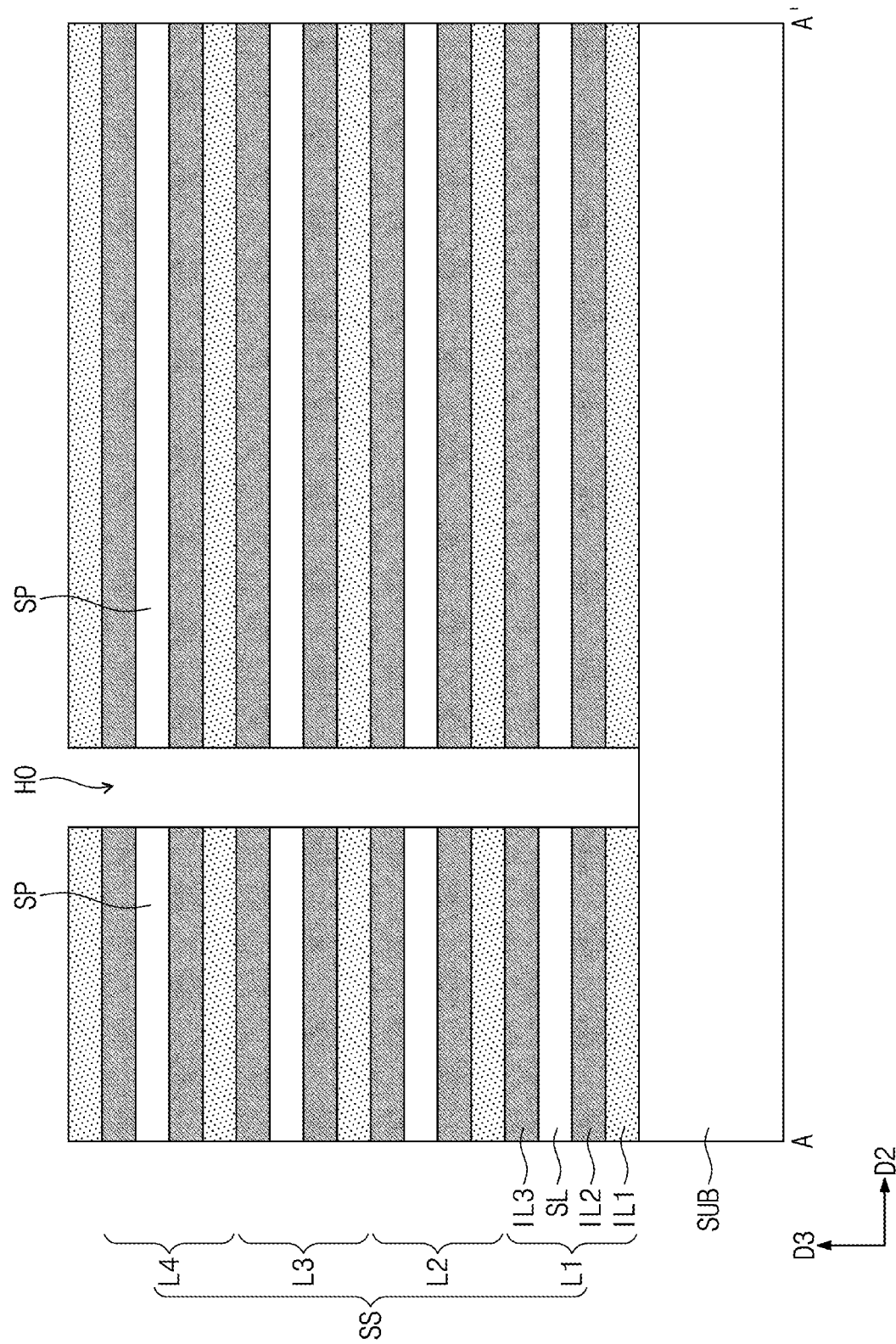

Referring to FIGS. 8, 9A, and 9B, the stack SS may be patterned to form a plurality of holes HO penetrating the stack SS. When viewed in a plan view, each of the holes HO may have a circular or elliptical shape. Each of the holes HO may have various shapes. The holes HO may be arranged in the first direction D1. The holes HO may be spaced apart from each other in the first direction D1.

The hole HO may be formed to penetrate the semiconductor patterns SP, which are vertically stacked on the substrate SUB. For example, the hole HO may be formed to penetrate a center region of each of the semiconductor patterns SP in the first direction D1. A diameter of the hole HO may be smaller than a width of the semiconductor pattern SP in the first direction D1. The hole HO may expose inner side surfaces of the semiconductor patterns SP, which are vertically stacked on the substrate SUB. The hole HO may also expose inner side surfaces of the first to third insulating layers IL1, IL2, and IL3, which are vertically stacked on the substrate SUB. In some embodiments, each of the holes HO may not have a circular shape, and a width (e.g., a widest width) of each of the holes HO in the first direction D1 may be smaller than the width of the semiconductor pattern SP in the first direction D1.

Figure 10:
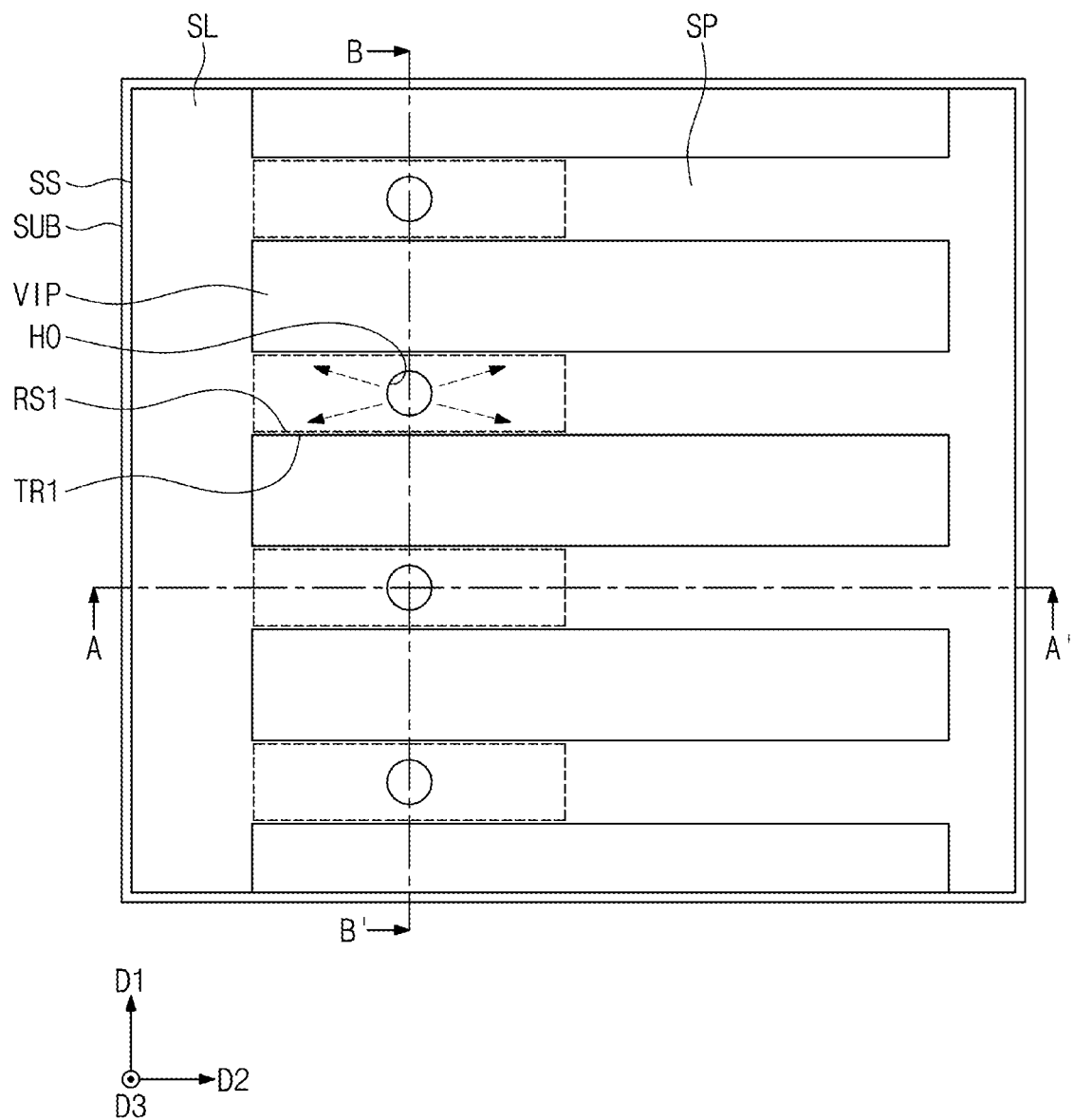

Referring to FIGS. 10, 11A, and 11B, the second and third insulating layers IL2 and IL3 exposed to the hole HO may be partially removed to form first recesses RS1. The partial removal of the second and third insulating layers IL2 and IL3 may include, for example, performing a wet etching process to selectively etching the second and third insulating layers IL2 and IL3.

The first recess RS1 may be horizontally extended from the hole HO. For example, the first recess RS1 may be extended from the hole HO in the first and second directions D1 and D2. A pair of the first recesses RS1 may be formed in each of the first to fourth layers L1-L4. For example, the pair of the first recesses RS1 may be formed on and below the semiconductor pattern SP. The first and second surfaces SPa and SPb of the semiconductor pattern SP may be partially exposed to the first recesses RS1.

Referring to FIGS. 12, 13A, 13B, and 13C, the gate insulating layer GI may be conformally formed in the hole HO and the first recesses RS1 extended therefrom. The gate insulating layer GI may cover the exposed portions of the first and second surfaces SPa and SPb of the semiconductor pattern SP.

The first spacers SPC1 and the second spacers SPC2 may be formed on the gate insulating layer GI to partially fill the first recesses RS1. The formation of the first and second spacers SPC1 and SPC2 may include, for example, forming a spacer layer in the first recesses RS1 and performing a wet etching process on the spacer layer.

The gate electrode GE may be formed on the gate insulating layer GI to fill the first recesses RS1 and the hole HO. The gate electrode GE may include the first and second horizontally-extended portions HP1 and HP2, which fill the first recesses RS1, and the pillar portion PI, which fills the hole HO. The first horizontally-extended portion HP1 may be formed on the first surface SPa of the semiconductor pattern SP, and the second horizontally-extended portion HP2 may be formed on the second surface SPb of the semiconductor pattern SP. In some embodiments, the pillar portion PI may have a width (e.g., a widest width) in the first direction D1, which is narrower than the width of the semiconductor pattern SP in the first direction D1 as illustrated in FIG. 12. In some embodiments, the pillar portion PI may have a width in any horizontal direction which is narrower than the width of the semiconductor pattern SP in the first direction D1 as illustrated in FIG. 12.

Figure 14:
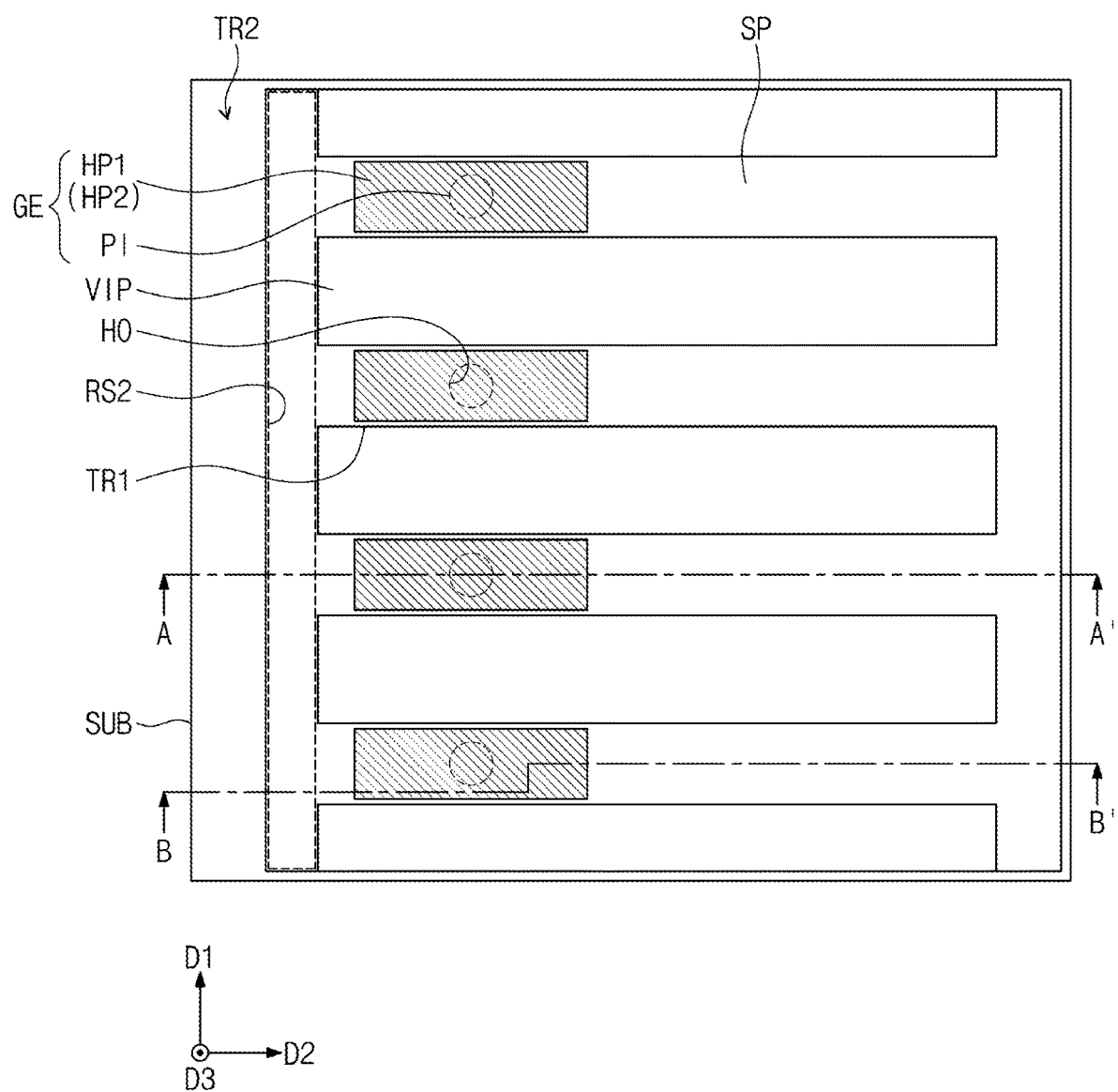
Figure 15A:
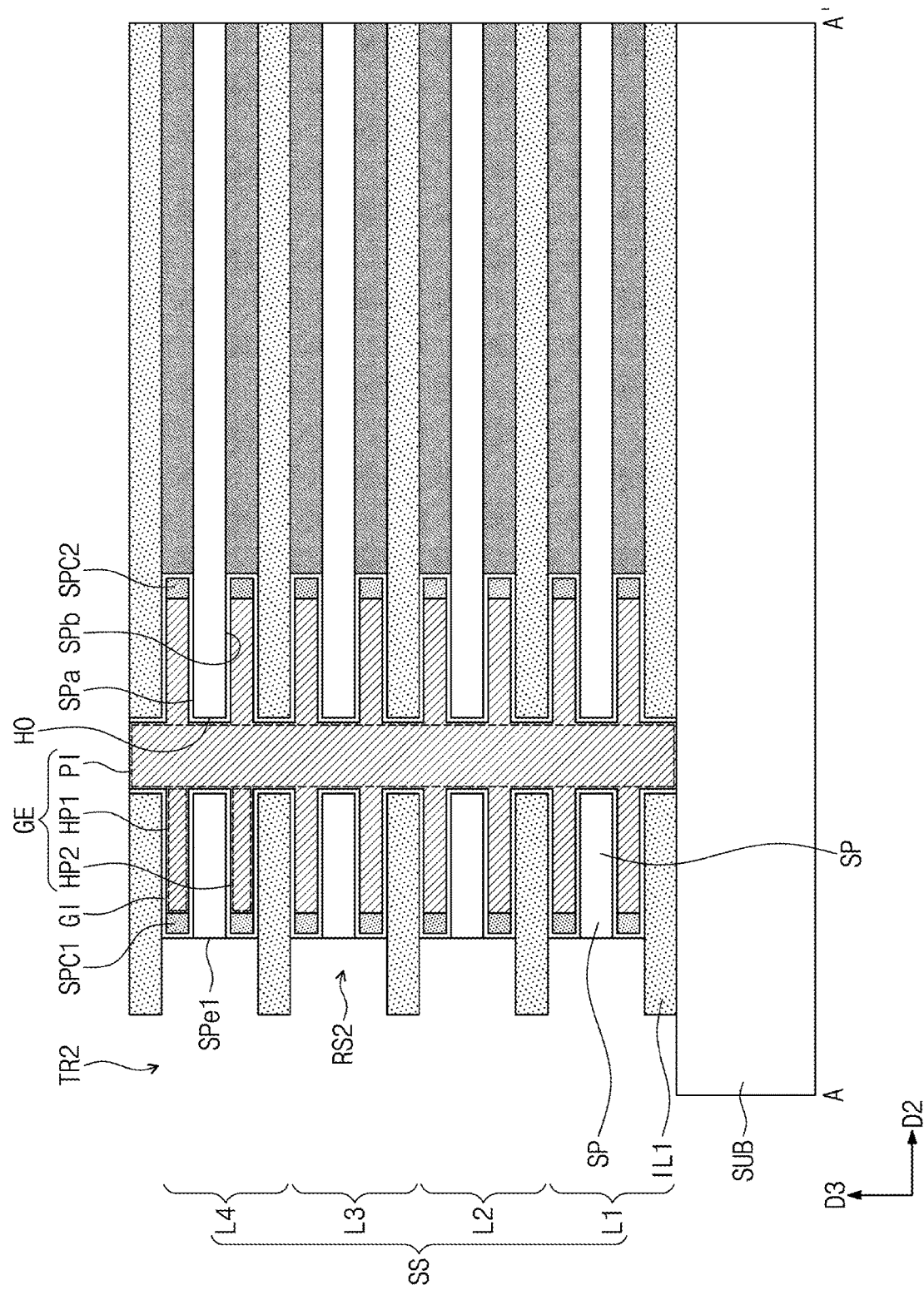
Figure 15B:
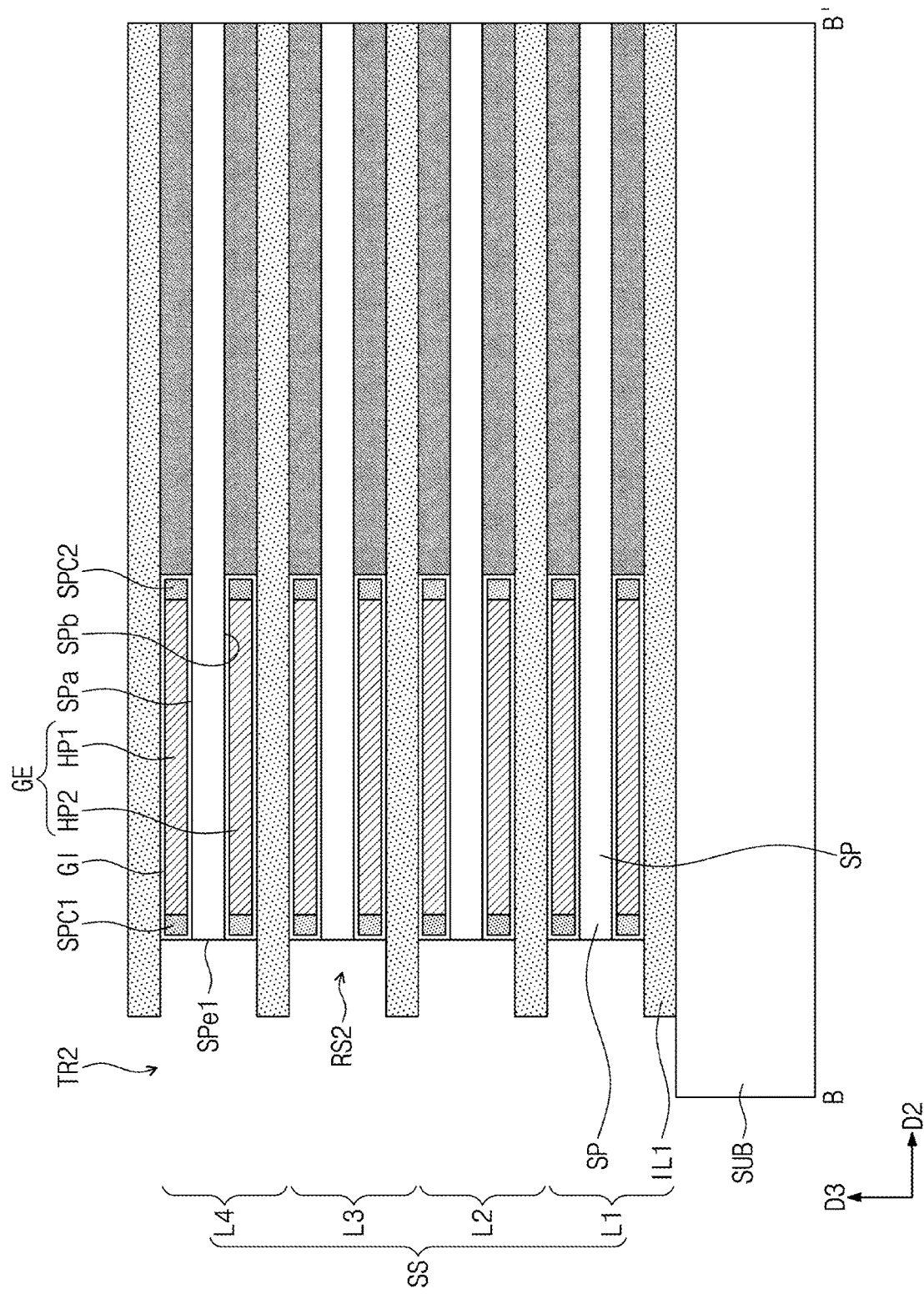

Referring to FIGS. 14, 15A, and 15B, the stack SS may be patterned to form a second trench TR2 at a side of the stack SS. The second trench TR2 may be extended in the first direction D1. The second trench TR2 may be formed to expose a side surface of the stack SS. The first to third insulating layers IL1. IL2, and IL3 and the semiconductor layer SL of the stack SS may be exposed through the second trench TR2.

The second and third insulating layers IL2 and IL3 and the semiconductor layer SL, which are exposed through the second trench TR2, may be etched to form second recesses RS2. The etching of the second and third insulating layers IL2 and IL3 may include, for example, performing a wet etching process to selectively remove the second and third insulating layers IL2 and IL3. The etching of the semiconductor layer SL may include performing, for example, a wet etching process to selectively remove a portion of the semiconductor layer SL. Since the portion of the semiconductor layer SL is removed, the semiconductor patterns SP may be formed between the first insulating layers IL1.

The second recess RS2 may be extended from the second trench TR2 in the second direction D2. The second recess RS2 may be extended in the first direction D1, when viewed in a plan view. One second recess RS2 may be formed in each of the first to fourth layers L1-L4. The second recess RS2 may expose a first end SPe1 of the semiconductor pattern SP.

Figure 16:
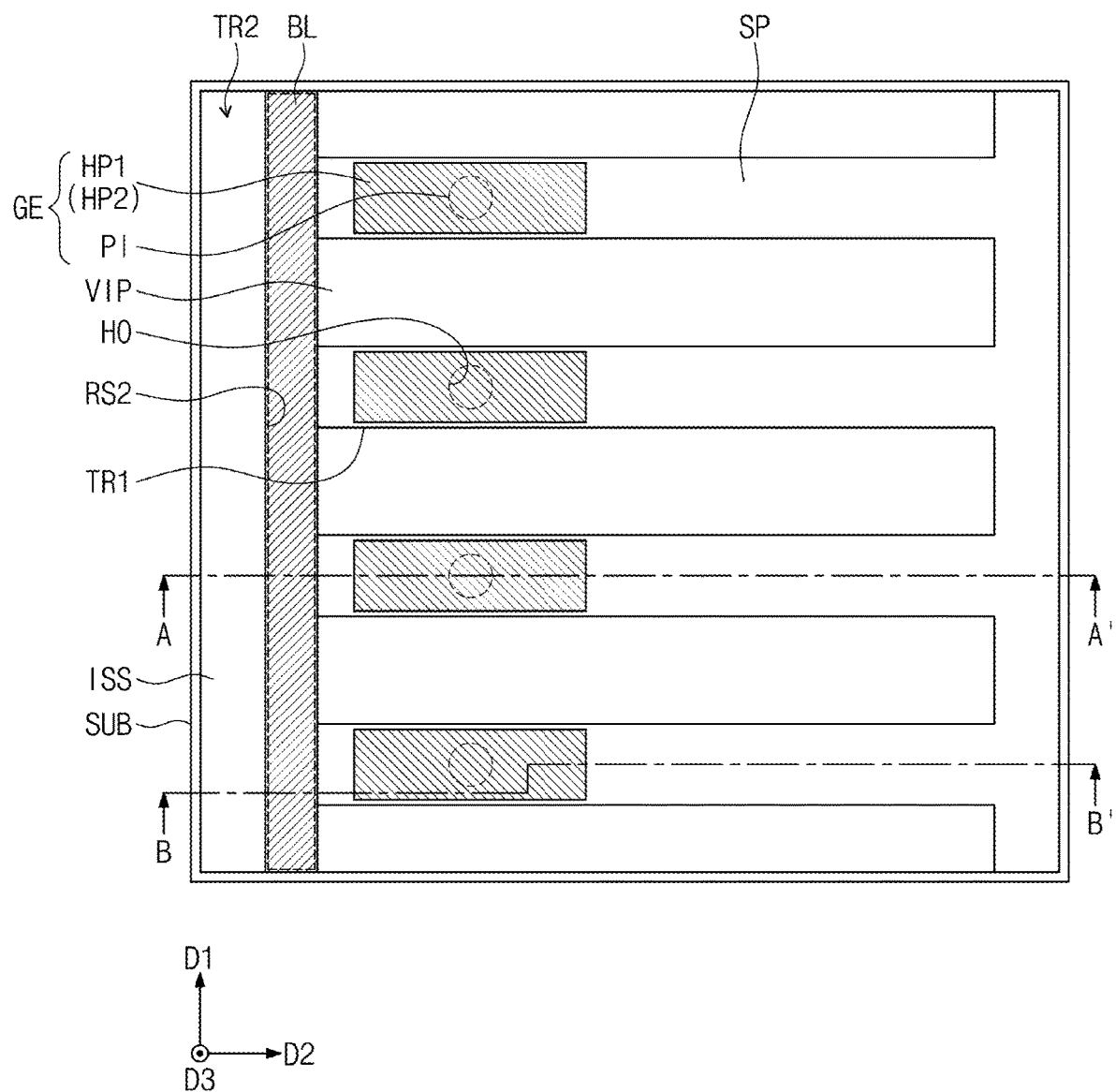
Figure 17A:
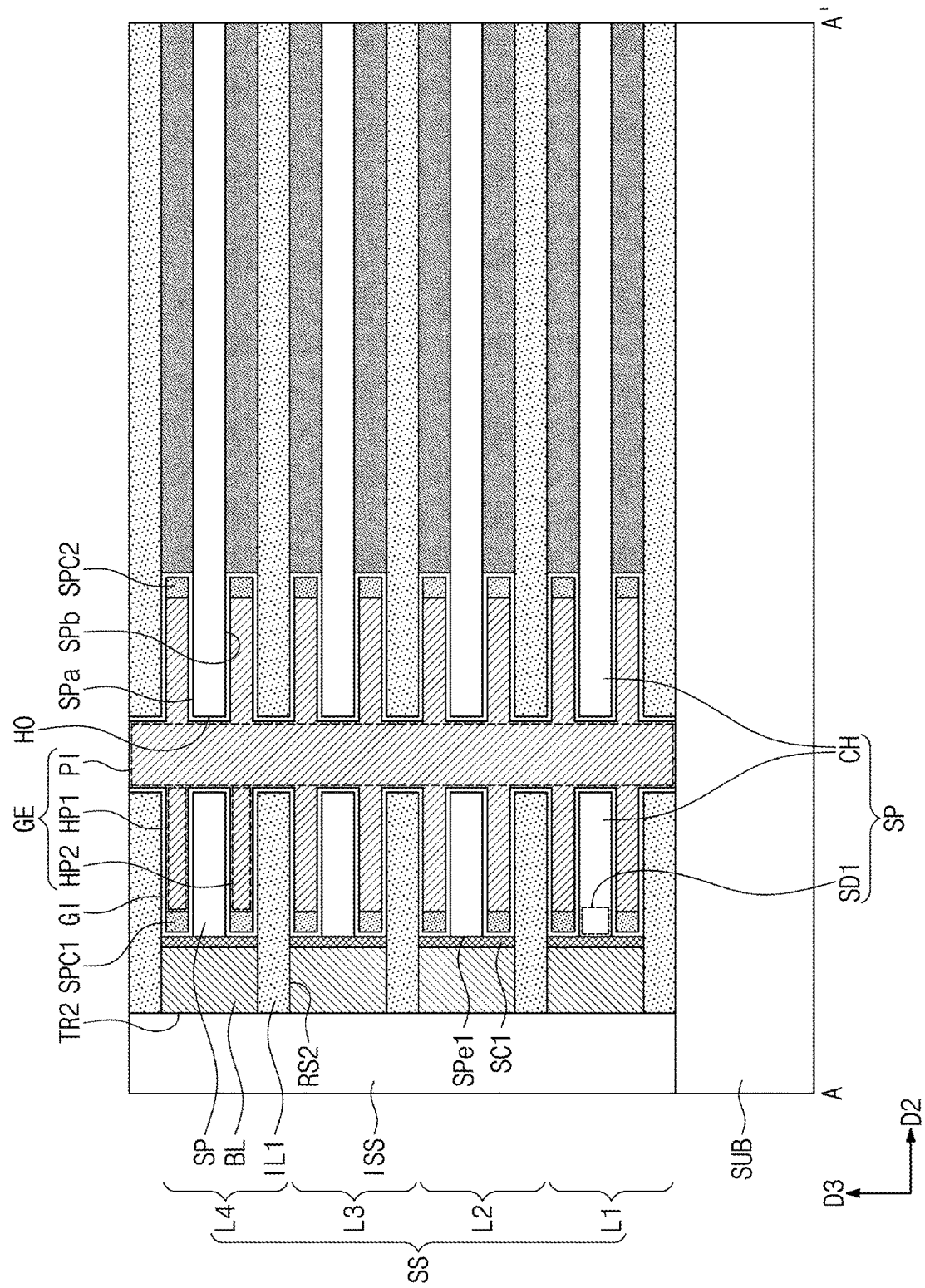
Figure 17B:
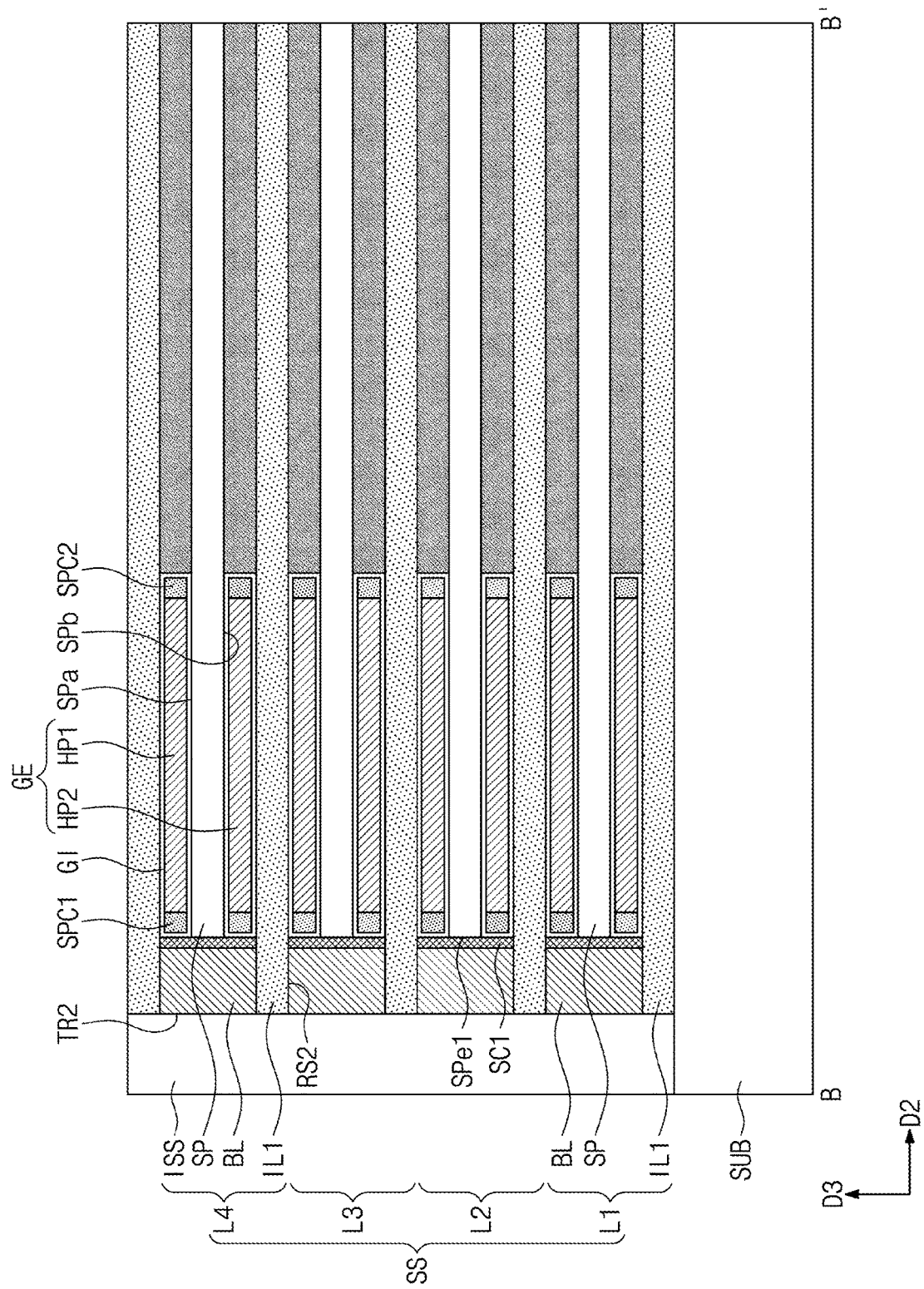

Referring to FIGS. 16, 17A, and 17B, the bit lines BL may be formed in the second recesses RS2, respectively. In some embodiments, the bit line BL may be formed by depositing a conductive material in the second recess RS2. The bit line BL may be extended in the first direction D1. The bit line BL may be electrically connected to the multiple semiconductor patterns SP that are arranged in the first direction D1.

The first silicide pattern SC1 may be formed between the bit line BL and each of the semiconductor patterns SP. The formation of the first silicide pattern SC1 may include performing a silicidation process on the exposed portion of the first end SPe1 of the semiconductor pattern SP.

The first impurity regions SD1 may be formed in the semiconductor patterns SP, respectively. The formation of the first impurity region SD1 may include doping the exposed portion of the first end SPe1 of the semiconductor pattern SP with impurities, before the forming of the first silicide pattern SC1.

The insulating structure ISS may be formed to fill the second trench TR2. The insulating structure ISS may be formed of or include, for example, at least one of silicon oxide, silicon nitride, or silicon oxynitride.

Figure 18:
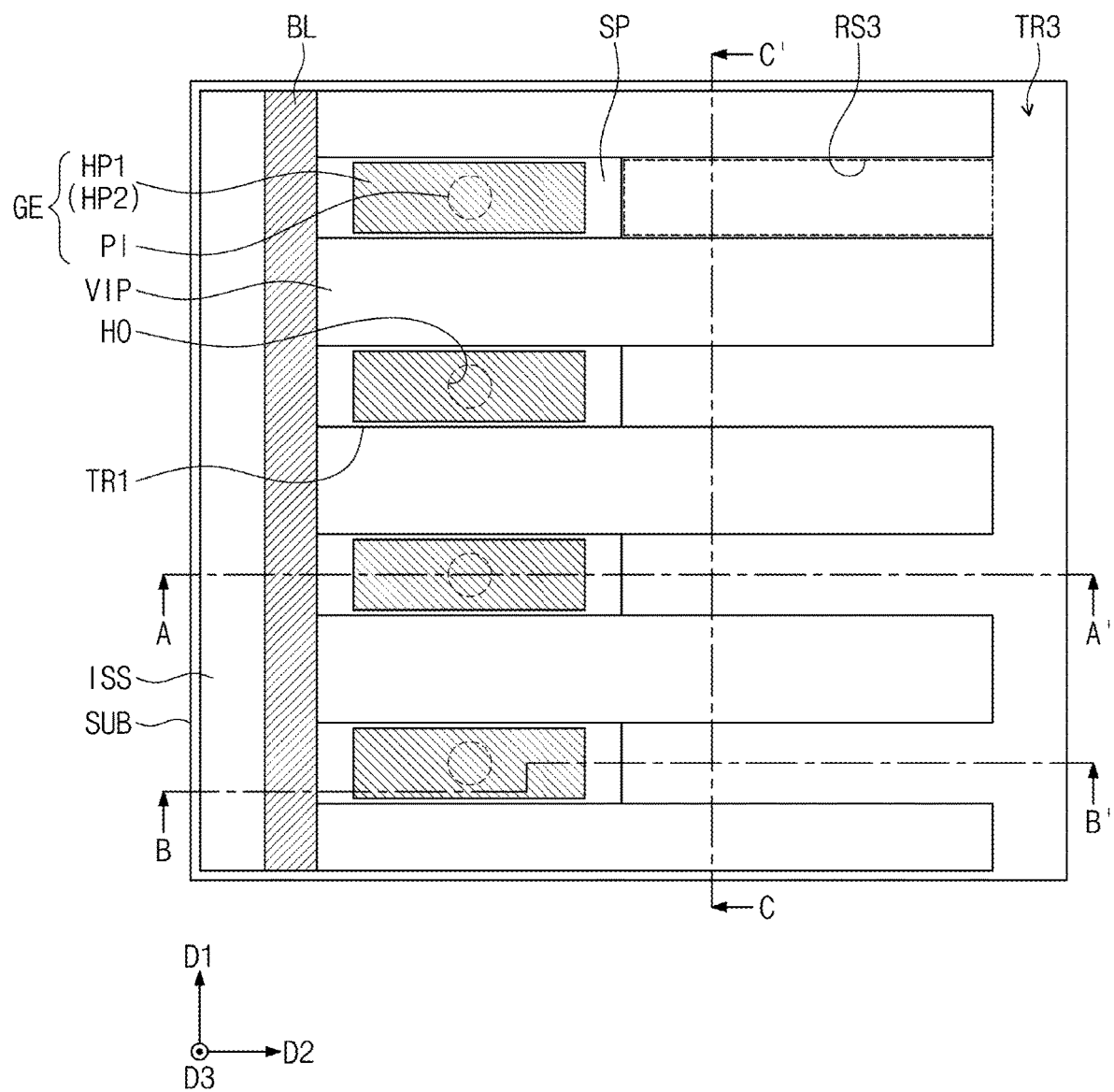
Figure 19A:
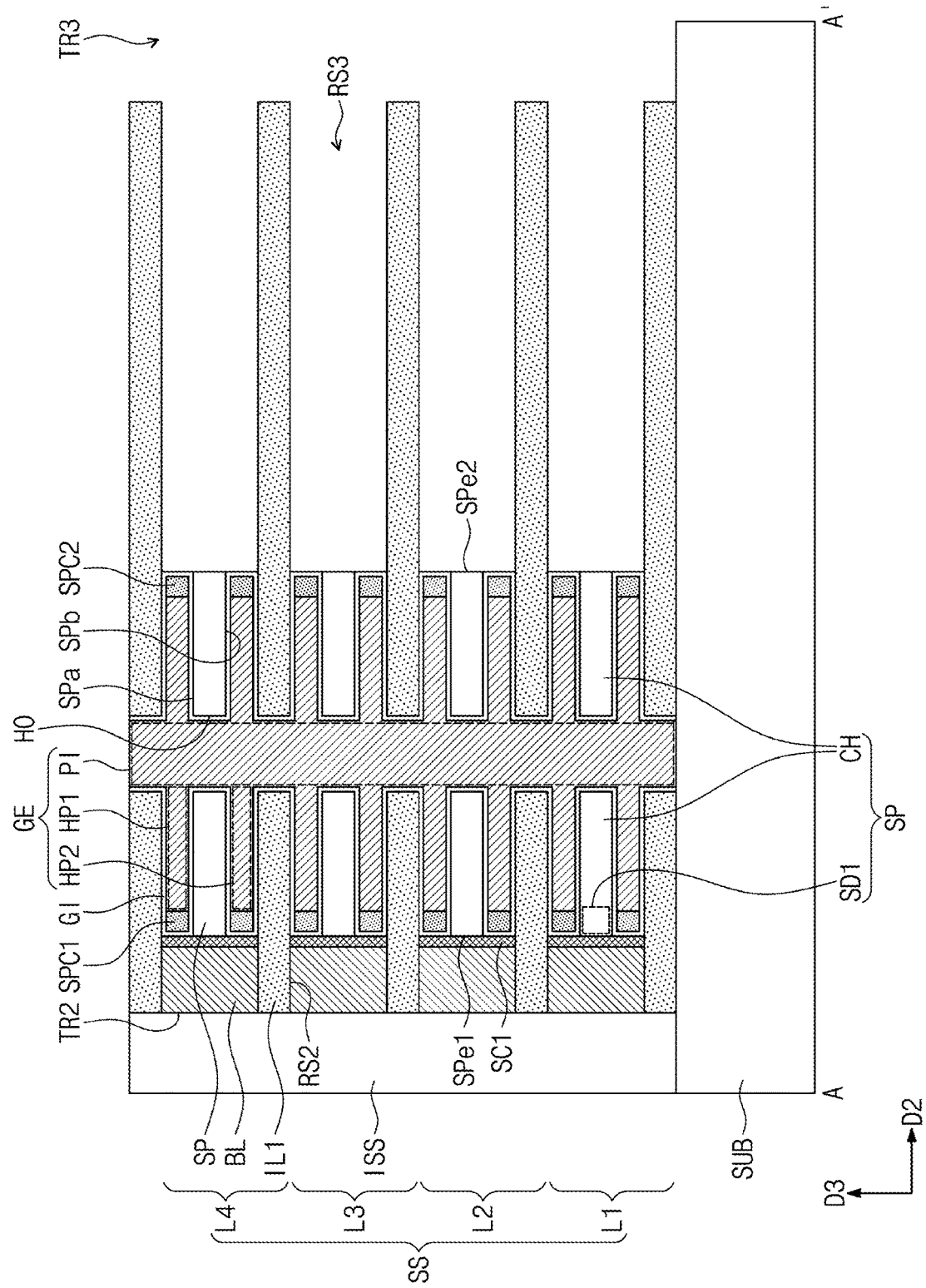
Figure 19B:
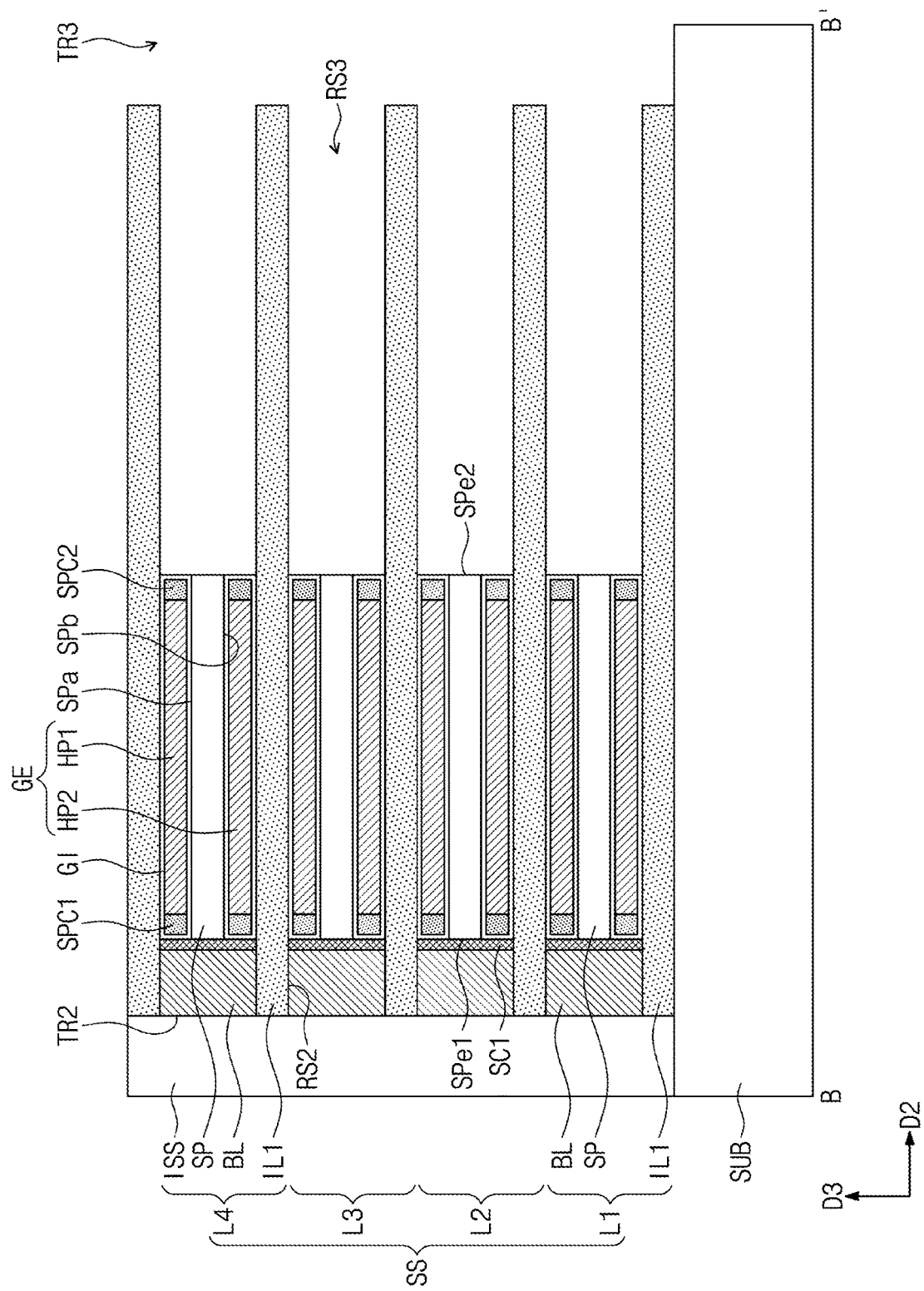
Figure 19C:
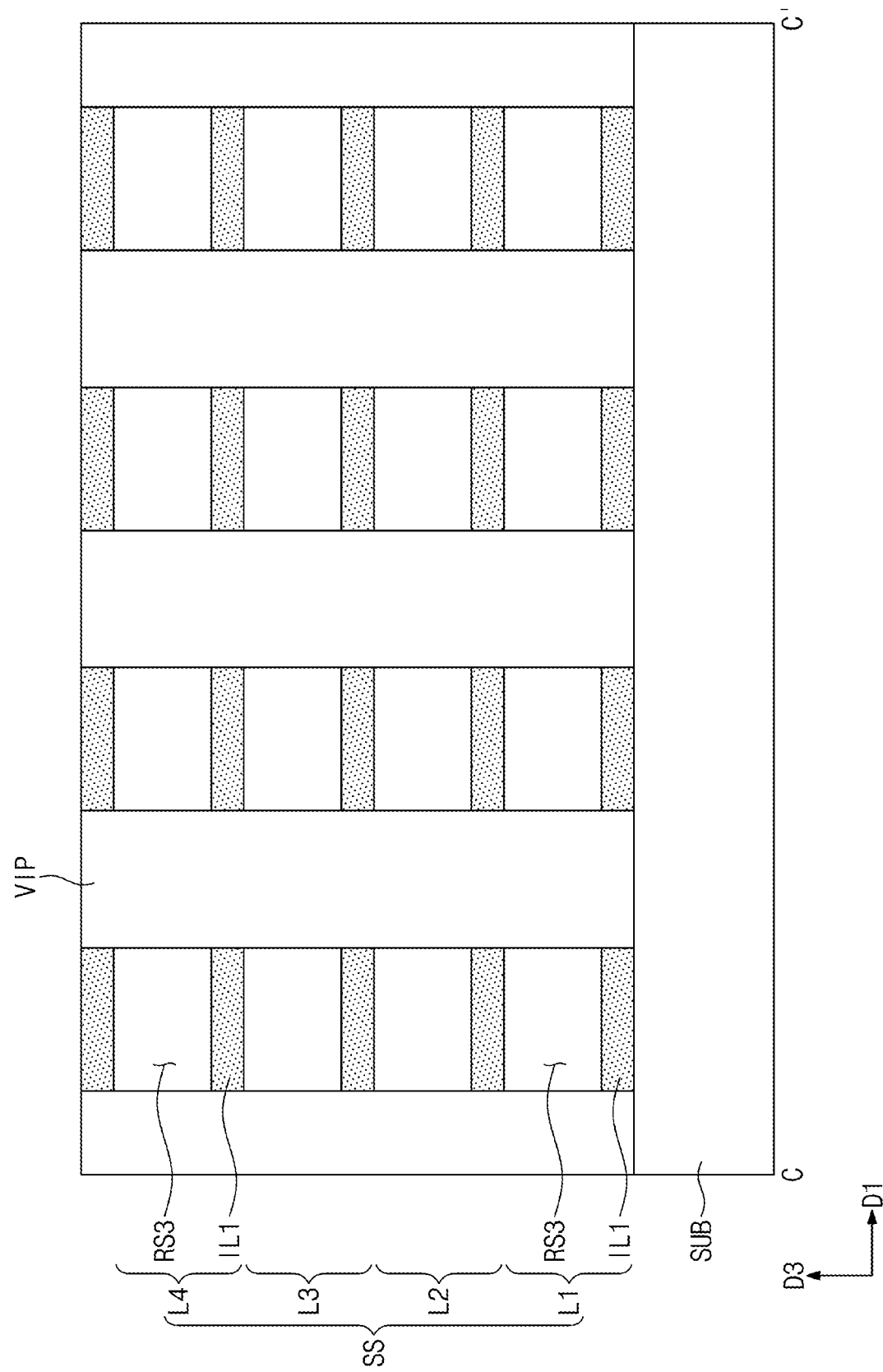
Figure 20:
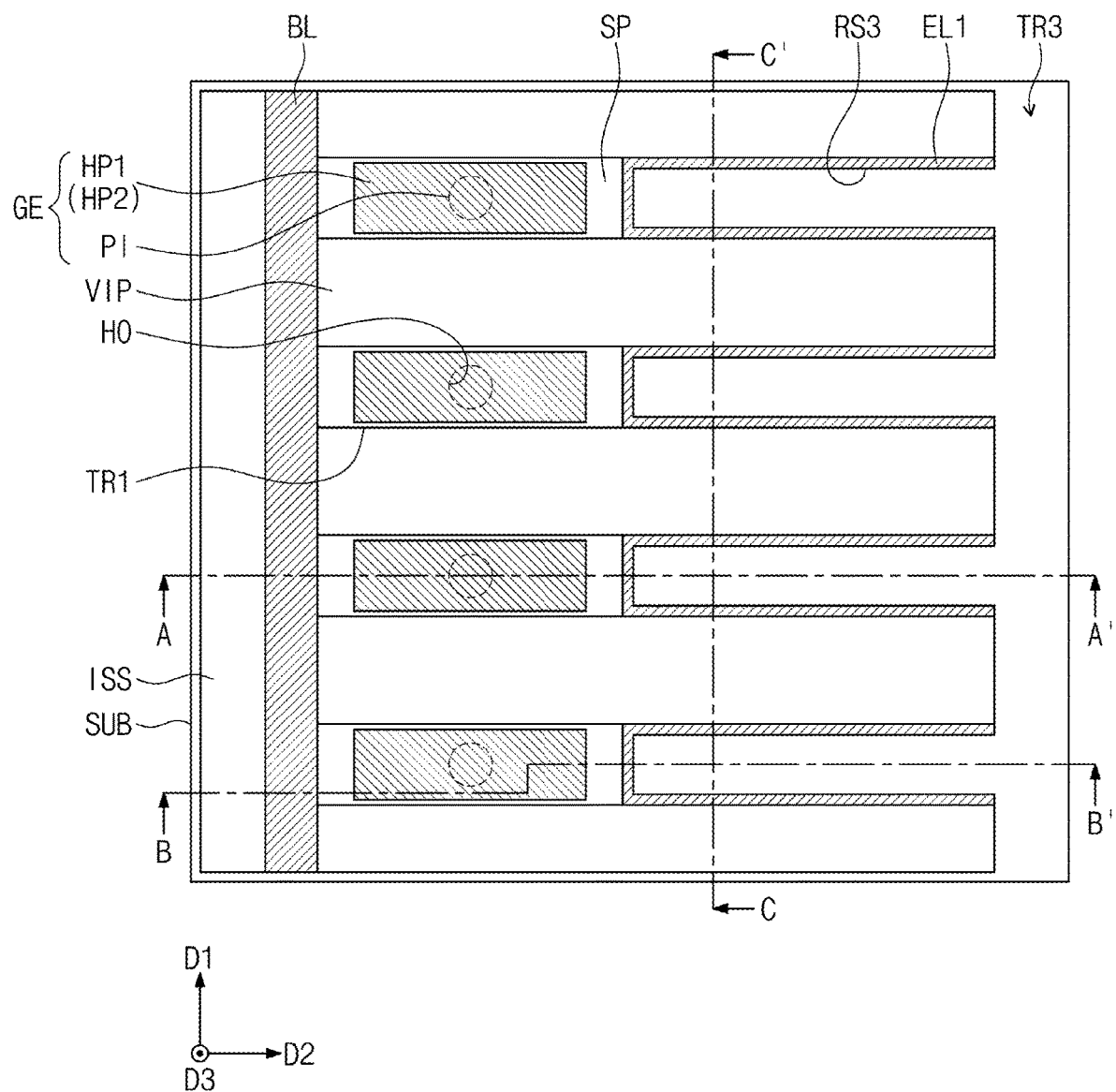

Referring to FIGS. 18, 19A, and 19B, the stack SS may be patterned to form a third trench TR3 at an opposite side of the stack SS. The third trench TR3 may be extended in the first direction D1. A side surface of the stack SS may be exposed through the third trench TR3. For example, the third trench TR3 may expose the first to third insulating layers IL1, IL2, and IL3 and the semiconductor patterns SP of the stack SS. The third trench TR3 may also expose a side surface of the vertical insulating layer VIP.

The second and third insulating layers IL2 and IL3 and the semiconductor patterns SP, which are exposed to the third trench TR3, may be etched to form third recesses RS3. The etching of the second and third insulating layers IL2 and IL3 may include, for example, performing a wet etching process to selectively remove the second and third insulating layers IL2 and IL3. The etching of the semiconductor patterns SP may include, for example, performing a wet etching process to selectively remove portions of the semiconductor patterns SP.

The third recess RS3 may be extended from a second end SPe2 of the semiconductor pattern SP toward the third trench TR3 in the second direction D2. The third recess RS3 may be interposed between a pair of the vertical insulating layers VIP, which are disposed adjacent to each other in the first direction D1. The third recess RS3 may expose the second end SPe2 of the semiconductor pattern SP.

Referring to FIGS. 20, 21A, 21B, and 21C, the second silicide pattern SC2 may be formed on the second end SPe2 of the semiconductor pattern SP exposed to the third recess RS3. The formation of the second silicide pattern SC2 may include performing a silicidation process on the second end SPe2 of the semiconductor pattern SP exposed to the third recess RS3.

The second impurity regions SD2 may be formed in the semiconductor patterns SP, respectively. The formation of the second impurity region SD2 may include doping the second end SPe2 of the semiconductor pattern SP, which is exposed by the third recess RS3, with impurities, before the formation of the second silicide pattern SC2.

The first electrodes EL1 may be formed in the third recesses RS3, respectively. For example, the formation of the first electrodes EL1 may include conformally forming a first electrode layer in the third recesses RS3 and performing a wet etching process on the first electrode layer to form a plurality of the first electrodes EL1 separated from each other. Accordingly, the first electrode EL1 may be formed to have a cylinder shape with one open end.

Referring back to FIGS. 3 and 4A to 4D, the dielectric layer DL may be conformally formed on the first electrodes ELL The dielectric layer DL may cover an exposed surface of the first electrode ELL The second electrode EL2 may be formed on the dielectric layer DL. The second electrode EL2 may be formed to fill (e.g., completely fill) the second and third recesses TR2 and RS3. The first electrode EL1, the dielectric layer DL, and the second electrode EL2 may constitute the data storing element DS (e.g., a capacitor).

Figure 22:
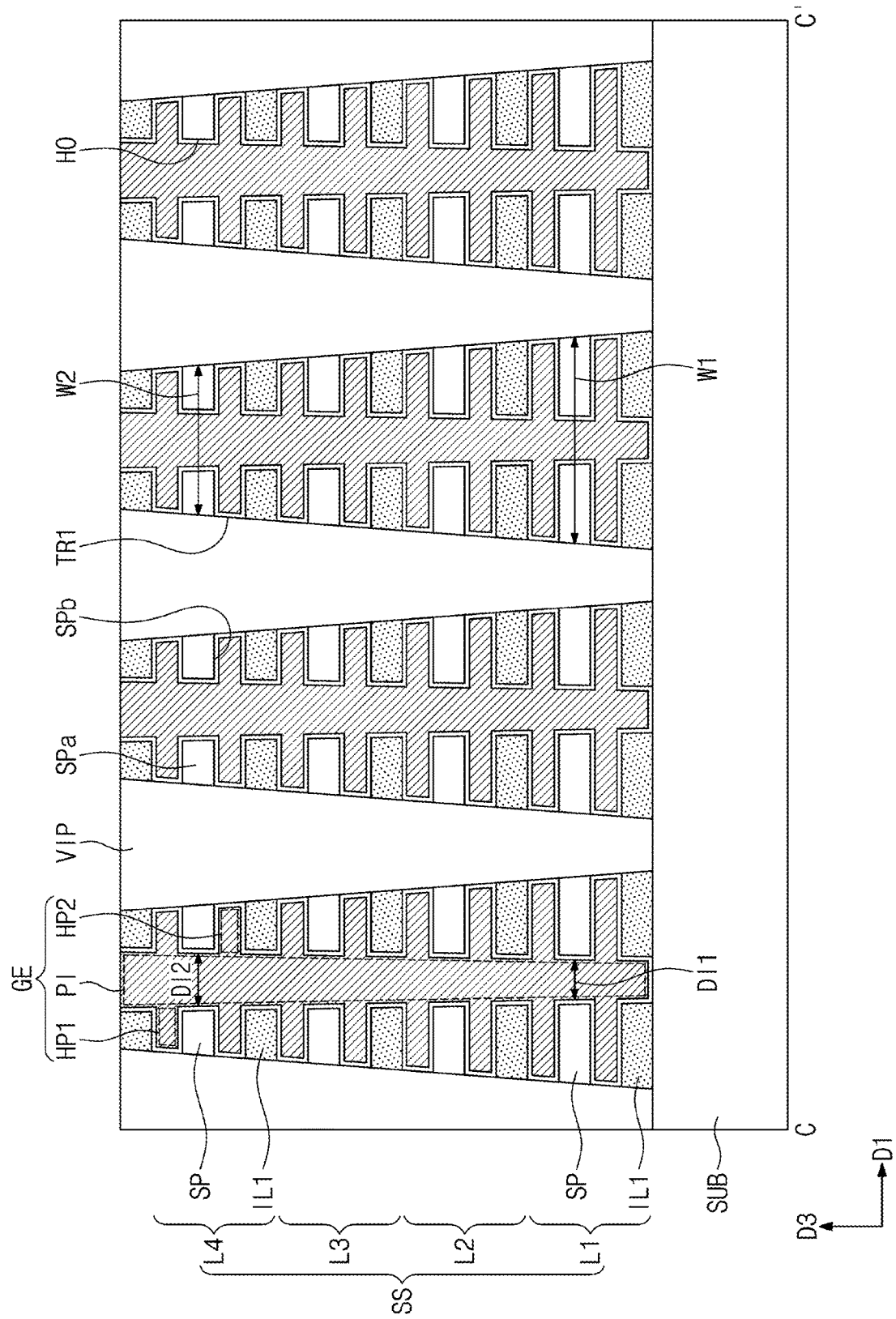
FIG. 22 is a sectional view taken along a line C-C' of FIG. 3 to illustrate a three-dimensional semiconductor memory device according to some embodiments of the inventive concept.

FIG. 22 is a sectional view taken along a line C-C' of FIG. 3 to illustrate a three-dimensional semiconductor memory device according to some embodiments of the inventive concept. For concise description, an element previously described with reference to FIGS. 3, 4A to 4D, and 5 will be identified by the same reference number without repeating an overlapping description thereof, and features different from that of the previous embodiment will be described in more detail below.

Referring to FIGS. 3 and 22, when measured in the first direction D1, widths of the semiconductor patterns SP, which are stacked in the first to fourth layers L1-L4, may monotonically or gradually decrease from the first layer L1 to the fourth layer L4. For example, when measured in the first direction D1, the semiconductor pattern SP in the first layer L1 may have a first width W1, and the semiconductor pattern SP in the fourth layer L4 may have a second width W2. Here, the first width W1 may be greater than the second width W2.

A diameter of the pillar portion PI of the gate electrode GE may monotonically or gradually increase from the first layer L1 to the fourth layer L4. For example, a diameter of the pillar portion PI adjacent to the semiconductor pattern SP in the first layer L1 may be a first diameter DI1, and a diameter of the pillar portion PI adjacent to the semiconductor pattern SP in the fourth layer L4 may be a second diameter DI2. Here, the first diameter DI1 may be smaller than the second diameter DI2.

When measured in the first direction D1, the first and second horizontally-extended portions HP1 and HP2 of the gate electrode GE may have widths monotonically or gradually decreasing from the first layer L1 to the fourth layer L4. The width, in the first direction D1, of the first horizontally-extended portion HP1 may be smaller than the width, in the first direction D1, of the second horizontally-extended portion HP2 thereunder. This is because the first horizontally-extended portion HP1 on the first surface SPa of the semiconductor pattern SP is positioned at a higher level than the second horizontally-extended portion HP2 on the second surface SPb.

In the process of patterning the stack SS to form the first trenches TR1, the stack SS may be formed to have a pyramid-shaped section in the first direction D1, as shown in FIG. 22.

The gate electrode GE may have a shape extending along the side surfaces of the stacked semiconductor patterns SP, as previously described with reference to FIG. 2. In this case, the gate electrode GE according to the present embodiment should be formed to be slantingly extended along the side surface of the pyramid-shaped stack SS. It may be very difficult to form the slantingly-extended gate electrode GE, and a process failure may occur.

According to some embodiments of the inventive concept, the gate electrode GE may be formed to have a pillar shape penetrating the stacked semiconductor patterns SP. Thus, the gate electrode GE may stably surround the semiconductor pattern SP, even when the widths of the stacked semiconductor patterns SP vary depending on their heights. As a result, it may be possible to improve electrical and reliability characteristics of a semiconductor memory device.

According to some embodiments of the inventive concept, a three-dimensional semiconductor memory device may have a hybrid gate structure, in which a double-gate structure and a channel-all-around gate structure are combined. Accordingly, a physical state of a channel region may be easily controlled by a gate electrode. In other words, it may be possible to improve electrical characteristics of the semiconductor memory device.

In a method of fabricating a three-dimensional semiconductor memory device according to some embodiments of the inventive concept, since the gate electrode is shaped like a pillar and is formed to penetrate vertically-stacked semiconductor patterns, it may be possible to prevent or suppress a process failure and to improve the reliability characteristics of the semiconductor memory device.

While example embodiments of the inventive concepts have been particularly shown and described, it will be understood by one of ordinary skill in the art that variations in form and detail may be made therein without departing from the scope of the inventive concept. Thus, to the maximum extent allowed by law, the scope is to be determined by the broadest permissible interpretation of the following claims and their equivalents, and shall not be restricted or limited by the foregoing detailed description,

What is claimed is:

1. A semiconductor memory device comprising:
a plurality of layers sequentially stacked on a substrate in a vertical direction, each of the plurality of layers comprising a bit line extending in a first direction and a semiconductor pattern extending from the bit line in a second direction that traverses the first direction;
a gate electrode comprising a vertical portion extending through the semiconductor patterns and a first horizontal portion extending from the vertical portion and facing a first surface of one of the semiconductor patterns, wherein the vertical portion comprises portions that are in respective ones of the semiconductor patterns; and
a data storing element electrically connected to the one of the semiconductor patterns,
wherein the data storing element comprises:
a first electrode electrically connected to the one of the semiconductor patterns;
a second electrode on the first electrode; and
a dielectric layer between the first electrode and the second electrode.

2. The semiconductor memory device of claim 1, wherein the gate electrode further comprises a second horizontal portion extending from the vertical portion and facing a second surface of the one of the semiconductor patterns, and the second surface of the one of the semiconductor patterns is opposite to the first surface of the one of the semiconductor patterns.

3. The semiconductor memory device of claim 2, further comprising a first insulating layer and a second insulating layer that is spaced apart from the first insulating layer in the vertical direction,
wherein the first and second horizontal portions of the gate electrode and one of the bit lines are between the first and second insulating layers.

4. The semiconductor memory device of claim 2, wherein the one of the semiconductor patterns comprises a channel region, and
wherein the first and second horizontal portions of the gate electrode are both configured to function as a gate of the channel region.

5. The semiconductor memory device of claim 2, wherein the second surface of the one of the semiconductor patterns faces the substrate.

6. The semiconductor memory device of claim 1, wherein the first horizontal portion overlaps the one of the semiconductor patterns.

7. The semiconductor memory device of claim 1, wherein the one of the semiconductor patterns comprises:
a first impurity region electrically connected to one of the bit lines;
a second impurity region electrically connected to the first electrode; and
a channel region between the first and second impurity regions, and
wherein the vertical portion extends through the channel region.

8. The semiconductor memory device of claim 7, wherein the channel region surrounds the vertical portion.

9. The semiconductor memory device of claim 1, wherein the plurality of layers comprise a first layer comprising a first semiconductor pattern and a second layer comprising a second semiconductor pattern, and the first layer is between the substrate and the second layer, and
a first width of the first semiconductor pattern in the first direction is wider than a second width of the second semiconductor pattern in the first direction.

10. The semiconductor memory device of claim 9, wherein a third width of the vertical portion adjacent to the first semiconductor pattern is narrower than a fourth width of the vertical portion adjacent to the second semiconductor pattern.

11. A semiconductor memory device comprising:
a plurality of layers sequentially stacked on a substrate in a vertical direction, each of the plurality of layers comprising a bit line extending in a first direction and a semiconductor pattern extending from the bit line in a second direction that traverses the first direction;
a gate electrode extending through the plurality of layers;
a data storing element electrically connected to one of the semiconductor patterns; and
a first insulating layer and a second insulating layer that is spaced apart from the first insulating layer in the vertical direction,
wherein the gate electrode comprises:
a vertical portion extending through the semiconductor patterns;
a first horizontal portion extending from the vertical portion and facing a first surface of the one of the semiconductor patterns; and
a second horizontal portion extending from the vertical portion and facing a second surface of the one of the semiconductor patterns, wherein the second surface of the one of the semiconductor patterns is opposite to the first surface of the one of the semiconductor patterns, and
wherein the first and second horizontal portions of the gate electrode and one of the bit lines are between the first and second insulating layers.

12. The semiconductor memory device of claim 11, wherein the data storing element comprises:
a first electrode electrically connected to the one of the semiconductor patterns;
a second electrode on the first electrode; and
a dielectric layer between the first electrode and the second electrode.

13. The semiconductor memory device of claim 11, wherein the first horizontal portion overlaps the one of the semiconductor patterns that overlaps the second horizontal portion.

14. The semiconductor memory device of claim 11, wherein the one of the semiconductor patterns comprises:
a first impurity region electrically connected to one of the bit lines;
a second impurity region electrically connected to the data storing element; and
a channel region between the first and second impurity regions, and
wherein the vertical portion extends through the channel region.

15. A semiconductor memory device comprising:
a bit line extending on a substrate in a first direction;
a semiconductor pattern extending in a second direction that traverses the first direction, the semiconductor pattern comprising a first impurity region, a second impurity region, and a channel region between the first and second impurity regions, the first impurity region being electrically connected to the bit line;
a gate electrode comprising a vertical portion extending through the channel region of the semiconductor pattern and a first horizontal portion extending from the vertical portion and facing a first surface of the semiconductor pattern; and
a data storing element electrically connected to the second impurity region of the semiconductor pattern,
wherein the channel region surrounds the vertical portion of the gate electrode.

16. The semiconductor memory device of claim 15, wherein the semiconductor pattern is spaced apart from the substrate, and
the semiconductor pattern has a bar-shape extending in the second direction, when viewed in a plan view.

17. The semiconductor memory device of claim 15, wherein the gate electrode further comprises a second horizontal portion extending from the vertical portion and facing a second surface of the semiconductor pattern opposite to the first surface of the semiconductor pattern.

18. The semiconductor memory device of claim 17, wherein the second surface of the semiconductor pattern faces the substrate.

19. The semiconductor memory device of claim 17, further comprising a first insulating layer and a second insulating layer that is spaced apart from the first insulating layer in a vertical direction, wherein the first and second horizontal portions of the gate electrode are between the first and second insulating layers.

20. The semiconductor memory device of claim 15, wherein the data storing element comprises:
   a first electrode electrically connected to the second impurity region;
   a second electrode on the first electrode; and
   a dielectric layer between the first electrode and the second electrode.

* * * * *